US012796113B2

(12) United States Patent
Taylor et al.

(10) Patent No.: US 12,796,113 B2
(45) Date of Patent: Nov. 10, 2026

(54) PHOTOVOLTAIC DEVICES AND METHODS OF MAKING THE SAME

(71) Applicant: NEW YORK UNIVERSITY, New York, NY (US)

(72) Inventors: André D. Taylor, Brooklyn, NY (US); Benjamin Edward Sartor, Brooklyn, NY (US); Jason Samuel Lipton, Brooklyn, NY (US); Jason A. Röhr, Brooklyn, NY (US)

( * ) Notice: Subject to any disclaimer, the term of this patent is extended or adjusted under 35 U.S.C. 154(b) by 0 days.

(21) Appl. No.: 17/680,716

(22) Filed: Feb. 25, 2022

(65) Prior Publication Data

US 2022/0359779 A1 Nov. 10, 2022

Related U.S. Application Data

(60) Provisional application No. 63/154,260, filed on Feb. 26, 2021.

(51) Int. Cl.

*H10F 19/90* (2025.01)
*H10F 71/00* (2025.01)
*H10F 77/12* (2025.01)
*H10F 10/162* (2025.01)

(52) U.S. Cl.

CPC ......... *H10F 19/908* (2025.01); *H10F 71/125* (2025.01); *H10F 77/12* (2025.01); *H10F 10/162* (2025.01)

(58) Field of Classification Search

None
See application file for complete search history.

(56) References Cited

U.S. PATENT DOCUMENTS

2013/0213478 A1* 8/2013 Munteanu ............. H10F 77/126 257/E31.015
2021/0313120 A1* 10/2021 Pazniak ............... H10K 85/221
2022/0077329 A1* 3/2022 He .................... H01L 31/02168
2022/0085224 A1* 3/2022 Nabet .................. G02B 5/3033

(Continued)

FOREIGN PATENT DOCUMENTS

CN 109119495 A * 1/2019
CN 112366275 A * 2/2021 ............. H10K 30/80

OTHER PUBLICATIONS

English machine translation of Chu (CN-109119495-A) provided by the EPO website, All Pages, 2025. (Year: 2025).*

(Continued)

*Primary Examiner* — Daniel P Malley, Jr.
(74) *Attorney, Agent, or Firm* — Riverside Law LLP

(57) ABSTRACT

A photovoltaic device is described, the device comprising a transparent conducting electrode layer; a back contact layer comprising at least one MXene material; and an active layer, comprising a photovoltaic active material, disposed between the transparent conducting electrode layer and the back contact layer. Also described is a method of producing a photovoltaic device, the method comprising the steps of providing substrate, depositing a transparent conducting electrode over the substrate; depositing an active layer comprising a photovoltaic material over the transparent conducting electrode; and depositing an MXene layer material over the active layer. A method of generating electricity using the disclosed device is also described.

17 Claims, 18 Drawing Sheets

(56) References Cited

U.S. PATENT DOCUMENTS

2023/0165033 A1* 5/2023 Lee ........................ C01B 32/914
250/206

OTHER PUBLICATIONS

English machine translation of Xu (CN-112366275-A) provided by the EPO website, All Pages, 2025. (Year: 2025).*
Agresti, A. et al. Titanium-carbide MXenes for work function and interface engineering in perovskite solar cells Nat. Mater. 2019, 18, 1228.
Anasori, B. et al. 2D metal carbides and nitrides (MXenes) for energy storage Nat. Rev. Mater. 2017, 2, 16098.
Gogotsi, Y.; Anasori, B. The Rise of MXenes ACS Nano 2019, 13, 8491.
Kamysbayev, V. et al. Covalent surface modifications and superconductivity of two-dimensional metal carbide MXenes Science 2020, 369, 979.
Lipton, J. et al. Layer-by-Layer Assembly of Two-Dimensional Materials: Meticulous Control on the Nanoscale Matter 2020, 2, 1149.
Lipton, J. et al. Mechanically strong and electrically conductive multilayer MXene nanocomposites Nanoscale 2019, 11, 20295.
Lipton, J. et al. Scalable, Highly Conductive, and Micropatternable MXene Films for Enhanced Electromagnetic Interference Shielding Matter 2020, 3, 546.
Liyanage, G. K. et al. The Role of Back Buffer Layers and Absorber Properties for >25% Efficient CdTe Solar Cells ACS Appl. Energy Mater. 2019, 2, 5419.
Maleski, M. et al. Dispersions of Two-Dimensional Titanium Carbide MXene in Organic Solvents Chem. Mater. 2017, 29, 1632.
Mariano, M. et al. Solution-processed titanium carbide MXene films examined as highly transparent conductors Nanoscale 2016, 8, 16371.
Mathis, T. S. et al. Modified MAX Phase Synthesis for Environmentally Stable and Highly Conductive Ti3C2 MXene ACS Nano 2021, 15, 6420.
Naguib, M. et al. Two-Dimensional Nanocrystals Produced by Exfoliation of Ti3AlC2 Adv. Mater. 2011, 23, 4248.
Seredych, M. et al. High-Temperature Behavior and Surface Chemistry of Carbide MXenes Studied by Thermal Analysis Chem. Mater. 2019, 31, 3324.
Weng, G.-M. et al. Layer-by-Layer Assembly of Cross-Functional Semi-transparent MXene-Carbon Nanotubes Composite Films for Next-Generation Electromagnetic Interference Shielding Adv. Funct. Mater. 2018, 28, 1803360.
Yin, L. et al. MXenes for Solar Cells Nano-Micro Lett. 2021, 13, 78.
Yu, Z. et al. MXenes with tunable work functions and their application as electron- and hole-transport materials in non-fullerene organic solar cells J. Mater. Chem. A 2019, 7, 11160.
Znajdek, K. et al. Analysis of back contact layers for flexible CdTe/CdS photovoltaic structures. Opto-Electron. Rev. 2019, 27, 32.

* cited by examiner

PHOTOVOLTAIC DEVICES AND METHODS OF MAKING THE SAME

CROSS-REFERENCE TO RELATED APPLICATIONS

The present application claims priority to U.S. Provisional Application No. 63/154,260, filed Feb. 26, 2021, which is incorporated by reference herein in its entirety.

BACKGROUND OF THE INVENTION

Cadmium telluride (CdTe) photovoltaics (PV) are the dominant thin-film technology at scale. Due to its rapid manufacturability, low cost, and high rate of recyclability, CdTe PV is well suited for helping to meet the demands of a net-zero carbon future that will require the deployment of many terawatts worth of PV arrays (Miller, et al. Thin Film CdTe Photovoltaics and the U.S. Energy Transition in 2020). In the past decade, improvements in device window layers (Paudel & Yan, Appl. Phys. Lett. 105, 183510 (2014)), carrier lifetimes (Kanevce, et al. Journal of Applied Physics 121, 214506 (2017)), and active layer dopant densities (Hall, Energy Sci. Eng. doi:10.1002/ese3.843) have pushed device efficiencies from 16.7% in 2011 to the current champion power conversion efficiency ($\eta$) of 22.1%; however, one of the outstanding challenges for achieving higher efficiency lies in the development of an effective back contact for a CdTe device (Liyanage, et al., ACS Appl. Energy Mater. 2, 5419-5426 (2019)). Relative to other semiconductors, CdTe has a high electron affinity ($\chi$=4.5 eV) and high bandgap ($E_g$=1.5 eV) which makes establishing p-type ohmic contact difficult. The work-function mismatch between the CdTe surface and back contact can induce downward band-bending, resulting in barriers to hole extraction and trapping of back-diffused electrons. Such downward band bending and rapid surface recombination of trapped electrons can lead to a reduction of the device external open circuit voltage ($V_{OC}$) and fill factor (FF) (Sood, M. et al. *Prog Photovolt Res Appl.* 2022; 30(3):263-275).

Many different back contact materials have been developed for p-type CdTe. High work-function metal contacts such as Te, Mo and Au have been extensively reported but result in small Schottky barriers and downwards band bending at the back interface (Ponpon, J. P. Solid-State Electronics 28, 689-706 (1985)). Cu, another high work function metal, is frequently used dope the CdTe absorber to suboptimal levels on the order of $10^{14}$-$10^{15}$ $cm^{-3}$. In addition, extrinsic doping with Cu forms $Cu_xTe$ at the back interface which acts as a "p+" layer, allowing carriers to tunnel through low Schottky barriers into the contact (Corwine, et al. Solar Energy Materials and Solar Cells 82, 481-489 (2004)); however, excess copper has been linked to accelerated device degradation and self-compensation of dopants when the density reaches above $10^{14}$ $cm^{-3}$. (Dobson, et al., Solar Energy Materials and Solar Cells 62, 295-325 (2000)). For these reasons, both academic and industrial CdTe producers are shifting away from Cu-doping in favor of group-V dopant chemistry, which requires low-barrier contacts. Cu-doped ZnTe has been a commonly used back contact buffer layer in the past decade as it benefits from a near-ideal band alignment with the CdTe interface and helps to immobilize copper ions that can accelerate device degradation (Gessert, et al. Thin Solid Films 517, 2370-2373 (2009); Uličná, S. et al. Vacuum 139, 159-163 (2017)). However, high surface recombination velocity at the CdTe/ZnTe interface through interfacial states can reduce the $V_{OC}$, and thus limit the overall device performance (Duenow and Metzger, Journal of Applied Physics 125, 053101 (2019)). Other contact materials such as metal oxides, metal pnictides, and organic polymers have also been investigated as back contacts. However, none have been able to address all the constraints of an industry-ready back contact, which include low Schottky barriers, low interfacial recombination, high electrical conductivity, low cost, low out-diffusion into a CdTe absorber and high temperature stability.

There remains a need in the art for efficient photovoltaic back-contacts. The present invention addresses this unmet need.

SUMMARY OF THE INVENTION

In one aspect, the present invention relates to a photovoltaic device comprising a transparent conducting electrode layer; a back contact layer comprising at least one MXene material; and an active layer, comprising a photovoltaic active material, disposed between the transparent conducting electrode layer and the back contact layer.

In one embodiment, the MXene material comprises an MXene selected from the group consisting of $Sc_2C$, $Sc_2N$, $Ti_2C$, $Ti_2N$, $V_2C$, $V_2N$, $Cr_2C$, $Cr_2N$, $Zr_2C$, $Zr_2N$, $Nb_2C$, $Nb_2N$, $Hf_2C$, $Hf_2N$, $Ta_2C$, $Mo_2C$, $Ti_3C_2$, $Ti_3N_2$, $V_3C_2$, $Ta_3C_2$, $Ta_3N_2$, $Mo_3C_2$, $(Cr_{2/3}\,Ti_{1/2})_3C_2$, $Ti_4C_3$, $Ti_4N_3$, $V_4C_3$, $V_4N_3$, $Ta_4C_3$, $Ta_4N_3$, $Nb_4C_3$, or a combination thereof. In one embodiment, the MXene material comprises $Ti_3C_2$. In one embodiment, the MXene material comprises terminations on at least one surface, the terminations comprising at least one functional group selected from the group consisting of alkoxide, carboxylate, halide, hydroxide, hydride, oxide, sub-oxide, nitride, sub-nitride, sulfide, and thiol. In one embodiment, the MXene material comprises terminations on at least one surface, wherein the terminations comprise at least one functional group selected from the group consisting of hydroxide, oxide, and sub-oxide. In one embodiment, the back contact layer is in direct contact with the active layer. In one embodiment, the device further comprises a Cu-doped layer disposed over the back contact layer. In one embodiment, the device further comprises a Cu-doped layer, disposed between the active layer and the back contact layer.

In one embodiment, the active layer comprises an n-type layer comprising an n-type photovoltaic material; and a p-type layer comprising a p-type photovoltaic material; wherein the n-type layer is disposed between the p-type layer and the transparent conducting electrode; and wherein the p-type layer is disposed between the n-type layer and the back contact layer. In one embodiment, the photovoltaic active material comprises CdTe, CdSeTe, or a combination thereof.

In another aspect, the present invention relates to a method of producing a photovoltaic device, the method comprising the steps of: providing a substrate; depositing a transparent conducting electrode over the substrate; depositing an active layer comprising a photovoltaic material over the transparent conducting electrode; and depositing a back contact layer comprising an MXene material over the active layer.

In one embodiment, the step of depositing an active layer comprises the steps of depositing an n-type layer comprising an n-type photovoltaic material over the transparent conducting electrode; and depositing a p-type layer comprising a p-type photovoltaic material over the n-type layer.

In one embodiment, the step of depositing a back contact layer over the active layer comprises the step of spray-coating the MXene material over the active layer. In one embodiment, the method further comprises the step of chemically modifying at least one surface of the MXene material. In one embodiment, the method further comprises the step of Cu-doping the MXene material. In one embodiment, the MXene material comprises an MXene selected from the group consisting of $Sc_2C$, $Sc_2N$, $Ti_2C$, $Ti_2N$, $V_2C$, $V_2N$, $Cr_2C$, $Cr_2N$, $Zr_2C$, $Zr_2N$, $Nb_2C$, $Nb_2N$, $Hf_2C$, $Hf_2N$, $Ta_2C$, $Mo_2C$, $Ti_3C_2$, $Ti_3N_2$, $V_3C_2$, $Ta_3C_2$, $Ta_3N_2$, $Mo_3C_2$, $(Cr_{2/3}\ Ti_{1/2})_3C_2$, $Ti_4C_3$, $Ti_4N_3$, $V_4C_3$, $V_4N_3$, $Ta_4C_3$, $Ta_4N_3$, $Nb_4C_3$, or a combination thereof. In one embodiment, the substrate comprises glass or a transparent organic polymer.

In one aspect, the present invention relates to a method of generating electricity, the method comprising the step of subjecting a photovoltaic device described herein to a light source.

BRIEF DESCRIPTION OF THE DRAWINGS

The following detailed description of preferred embodiments of the invention will be better understood when read in conjunction with the appended drawings. For the purpose of illustrating the invention, there are shown in the drawings embodiments which are presently preferred. It should be understood, however, that the invention is not limited to the precise arrangements and instrumentalities of the embodiments shown in the drawings.

DETAILED DESCRIPTION

Figure 1:
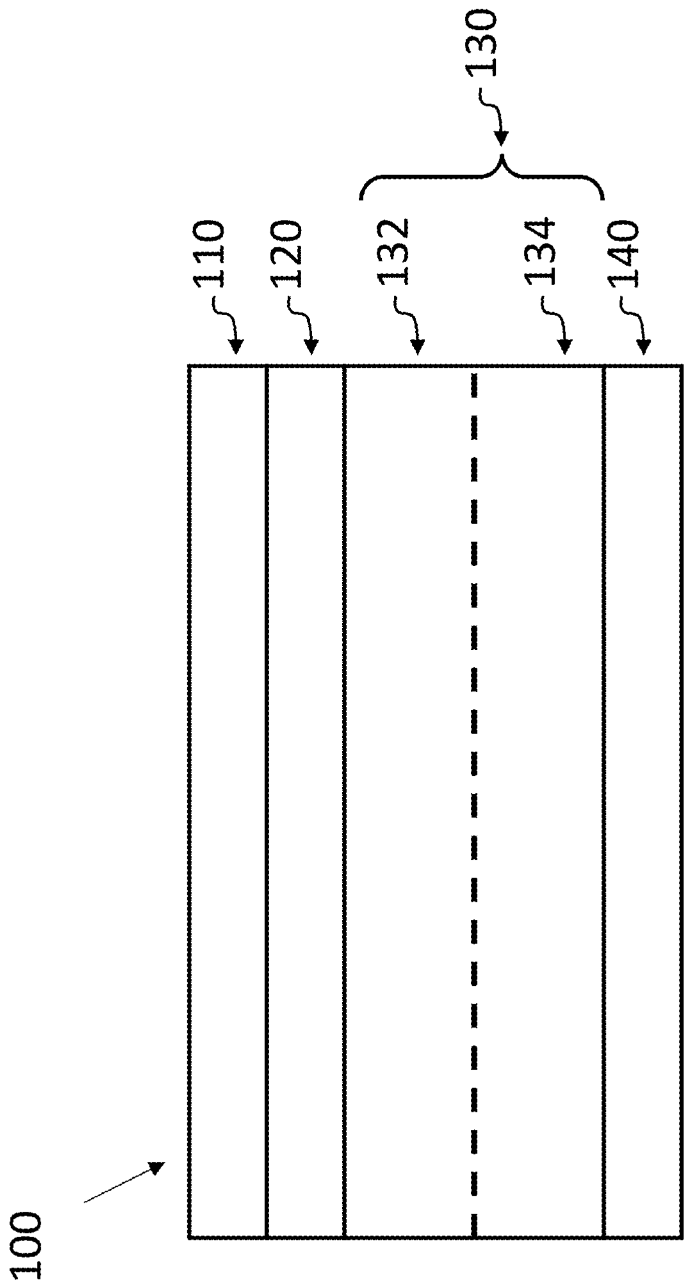
FIG. 1 depicts an exemplary device of the invention.

It is to be understood that the figures and descriptions of the present invention have been simplified to illustrate elements that are relevant for a clear understanding of the present invention, while eliminating, for the purpose of clarity, many other elements found in photovoltaic devices. Those of ordinary skill in the art may recognize that other elements and/or steps are desirable and/or required in implementing the present invention. However, because such elements and steps are well known in the art, and because they do not facilitate a better understanding of the present invention, a discussion of such elements and steps is not provided herein. The disclosure herein is directed to all such variations and modifications to such elements and methods known to those skilled in the art.

As used herein, each of the following terms has the meaning associated with it in this section. Unless defined otherwise, all technical and scientific terms used herein generally have the same meaning as commonly understood by one of ordinary skill in the art to which this invention belongs.

The articles "a" and "an" are used herein to refer to one or to more than one (i.e. to at least one) of the grammatical object of the article. By way of example, "an element" means one element or more than one element.

As used herein, the term "about" will be understood by persons of ordinary skill in the art and will vary to some extent depending on the context in which it is used. As used herein when referring to a measurable value such as an amount, a temporal duration, and the like, the term "about" is meant to encompass variations of 20% or ±10%, more preferably +5%, even more preferably ±1%, and still more preferably ±0.1% from the specified value, as such variations are appropriate to perform the disclosed methods.

As used herein, the term "substrate" refers to a structural surface beneath a layered material or coating (e.g., polymer coating).

Throughout this disclosure, various aspects of the invention can be presented in a range format. It should be understood that the description in range format is merely for convenience and brevity and should not be construed as an inflexible limitation on the scope of the invention. Accordingly, the description of a range should be considered to have specifically disclosed all the possible sub-ranges as well as individual numerical values within that range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 2.7, 3, 4, 5, 5.3, and 6. This applies regardless of the breadth of the range.

DESCRIPTION

The present invention is based in part on the unexpected result that MXenes function as back-contacts in CdTe photovoltaic devices.

Devices of the Invention

In one aspect, the present invention relates to a photovoltaic device comprising a transparent conducting electrode layer; a back contact layer comprising at least one MXene material; and an active layer, comprising a photovoltaic active material, disposed between the transparent conducting electrode layer and the back contact layer.

Exemplary device 100 is presented in FIG. 1. Device 100 may include a transparent surface 110, a transparent conducting electrode 110, an active layer 130, and a back contact layer 140. In one embodiment, active layer 130 comprises n-type layer 132 and p-type layer 134. In one embodiment, the n-p junction of the active layer may be defined as the interface between the n-type layer and the p-type layer. In one embodiment, back contact layer 140 is in direct contact with active layer 130. In one embodiment, back contact layer 140 further comprises a Cu-doped layer. In some embodiments, the device is further coated with additional transparent or semi-transparent layers of glass or plastic.

There is no particular limit on transparent surface 110 and may be any transparent surface known in the art. In one embodiment, transparent surface 110 comprises plastic or glass. In one embodiment, transparent surface 110 serves to protect the photovoltaic device from ambient conditions and permits efficient transmittance of light.

Transparent conducting electrode 110 comprises any transparent conducting material or semitransparent conducting material known in the art. In one embodiment, transparent conducting electrode comprises a transparent conducting oxide. Non-limiting examples of transparent conducting oxides include, indium tin oxide (ITO), indium zinc oxide (IZO), aluminum zinc oxide (AZO), amorphous zinc oxide (aZO), cadmium stannate ($Cd_2SnO_4$) zinc oxide (ZnO), tin oxide ($SnO_2$), indium oxide ($In_2O_3$), cadmium tin oxide, fluorinated tin oxide, and combinations thereof. In one embodiment, transparent conducting electrode 110 comprises an MXene material.

Active layer 230 may comprise any photovoltaic active material known in the art. In one embodiment, the photovoltaic active material comprises one or more of cadmium telluride (CdTe), cadmium sulphide (CdS), zinc telluride (ZnTe), zinc selenide (ZnSe), cadmium selenide (CdSe), cadmium telluride selenide (CdTeSe), cadmium zinc telluride (CdZnSe), cadmium zinc telluride selenide (CdZnTeSe), zinc sulphide (ZnS), indium selenide ($In_2Se_3$), indium sulphide ($In_2S_3$), zinc oxyhydrate, or any combination, alloy, or graded alloy thereof. In one embodiment, the active layer comprises CdTe.

In one embodiment, the active layer comprises an n-type layer comprising an n-type photovoltaic material. In one embodiment, the n-type photovoltaic material comprises any photovoltaic material disclosed herein. In one embodiment, the n-type photovoltaic material comprises a combination of photovoltaic materials. In one embodiment, the n-type photovoltaic material comprises CdTe, CdSe, CdSeTe, or a combination thereof.

In one embodiment, the active layer further comprises a p-type layer comprising an p-type photovoltaic material. In one embodiment, the p-type photovoltaic material comprises a combination of photovoltaic materials. In one embodiment, the p-type photovoltaic material comprises CdTe, CdSe, CdSeTe, or a combination thereof.

In one embodiment, the active layer is a bi-layer. In one embodiment, the active layer is comprises a graded concentration of n-type and p-type photovoltaic materials. In one embodiment, the active layer comprises a material having the formula $CdSe_xTe_{(1-x)}$, where the value of x is higher near transparent conducting electrode 110 and lower near back contact 140. In one embodiment, the value of "x" ranges $0.05<x<1.0$, $0.05<x<0.8$, $0.05<x<0.5$, or $0.05<x<0.30$ proximate to transparent conducting electrode 110. In one embodiment, the value of "x" is <0.01 proximate to back contact 140.

Back contact layer 140 comprises at least one MXene material. MXenes are a relatively young class of 2D solids, produced by the selective etching of the A-group layers from the MAX phases, a>70 member family of layered, hexagonal early transition metal carbides and nitrides.

MXene materials contemplated in these methods and compositions comprise materials having the formula $M_{(n+1)}X_nT_x$. These materials have at least one layer, and sometimes a plurality of layers, each layer having a first and second surface, each layer comprising a substantially two-dimensional array of crystal cells; each crystal cell having an empirical formula of $M_{(n+1)}X_n$, such that each X is positioned within an octahedral array of M, wherein M is at least one Group 3, 4, 5, 6, or 7 metal (corresponding to Group IIIB, IVB, VB, VIB or VIIB metal), wherein each X is C, N, or a combination thereof and n=1, 2, or 3; wherein at least one of said surfaces of the layers has surface terminations, $T_x$, comprising alkoxide, alkyl, carboxylate, halide, hydroxide, hydride, oxide, sub-oxide, nitride, sub-nitride, sulfide, sulfonate, thiol, or a combination thereof. In some embodiments, the M is at least one Group 4, 5, or 6 metal. In some embodiments, M is one or more of Hf, Cr, Mn, Mo, Nb, Sc Ta, Ti, V, W, or Zr, or a combination thereof. In other some embodiments, the transition metal is one or more of Ti, Zr, V, Cr, Mo, Nb, Ta, or a combination thereof. In some embodiments, the transition metal is Ti, Ta, Mo, Nb, V, Cr, or a combination thereof. In certain specific embodiments, $M_{(n+1)}X_n$ comprises a transition metal nitride or carbide material such as $Sc_2C$, $Sc_2N$, $Ti_2C$, $Ti_2N$, $V_2C$, $V_2N$, $Cr_2C$, $Cr_2N$, $Zr_2C$, $Zr_2N$, $Nb_2C$, $Nb_2N$, $Hf_2C$, $Hf_2N$, $Ta_2C$, $Mo_2Q$ $Ti_3C_2$, $Ti_3N_2$, $V_3C_2$, $Ta_3C_2$, $Ta_3N_2$, $Mo_3C_2$, $(Cr_{2/3}\ Ti_{1/2})_3C_2$, $Ti_4C_3$, $Ti_4N_3$, $V_4C_3$, $V_4N_3$, $Ta_4C_3$, $Ta_4N_3$, $Nb_4C_3$, or a combination thereof.

The range of compositions available can be seen as extending even further when one considers that each M-atom position within the overall $M_{(n+1)}X_n$ matrix can be represented by more than one element. That is, one or more type of M-atom can occupy each M-position within the respective matrices. In certain exemplary non-limiting examples, these can be $(M^A_xM^B_y)_2C$ or $(M^A_xM^B_y)_2N$, $(M^A_xM^B_y)_3C_2$ or $(M^A_xM^B_y)_3N_2$, or $(M^A_xM^B_y)_4C_3$ or $(M^A_xM^B_y)_4N_3$, where $M^A$ and $M^B$ are independently members of the same group, and x+y=1. For example, in but one non-limiting example, such a composition can be $(Vi_{/2}Cri_{/2})_3C_2$. In the same way, one or more type of X-atom can occupy each X-position within the matrices, for example solid solutions of the formulae $M_{n+1}(C_xN_y)_n$, or $(M^A_xM^B_y)_{n+1}(C_xN_y)_n$.

In more specific embodiments, the MXenes may comprise compositions having at least two Group 4, 5, 6, or 7 metals, and the $M_{(n+1)}X_nT_x$ composition is represented by a formula $M'_2M''_mX_{(m+1)}(T_x)$, where m=1 or 2 (where m=n−1, in the context of the general MXene formula. Typically, these are carbides (i.e., X is carbon). In these double transition metal carbides, M' may be Ti, V, Cr, or Mo. In these ordered double transition metal carbides, M" may be Ti, V, Nb, or Ta, provided that M' is different than M". These carbides may be ordered or disordered. Individual embodiments of the ordered double transition metal carbides include those compositions where $M'_2M''_mX_{m+1}$, is independently $Mo_2TiC_2$, $Mo_2VC_2$, $Mo_2TaC_2$, $Mo_2NbC_2$, $Mo_2Ti_2C_3$, $Cr_2TiC_2$, $Cr_2VC_2$, $Cr_2TaC_2$, $Cr_2NbC_2$, $Ti_2NbC_2$, $Ti_2TaC_2$, $V_2TaC_2$, $V_2TiC_2$, or a combination thereof. In some other embodiments, $M'_2M''_mX_{m+1}$, is independently $Mo_2TiC_2$, $Mo_2VC_2$, $Mo_2TaC_2$, $Mo_2NbC_2$, $Cr_2VC_2$, $Cr_2TaC_2$, $Cr_2NbC_2$, $Ti_2NbC_2$, $Ti_2TaC_2$, $V_2TaC_2$, $V_2TiC_2$, or a combination thereof. In other embodiments, $M'_2M''_mX_{m+1}$, is independently $Mo_2Ti_2C_3$, $Mo_2V_2C_3$, $Mo_2Nb_2C_3$, $Mo_2Ta_2C_3$, $Cr_2Ti_2C_3$, $Cr_2V_2C_3$, $Cr_2Nb_2C_3$, $Cr_2Ta_2C_3$, $Nb_2Ta_2C_3$, $Ti_2Nb_2C_3$, $Ti_2Ta_2C_3$, $V_2Ta_2C_3$, $V_2Nb_2C_3$, $V_2Ti_2C_3$, or a combination thereof. In still other embodiments, $M'_2M''_mX_{m+1}$, is independently $Nb_2VC_2$, $Ta_2TiC_2$, $Ta_2VC_2$, $Nb_2TiC_2$ or a combination thereof.

These MXene materials, described above as either $M_{(n+1)}X_nT_x$ or $M'_2M''_mX_{m+}i$, may be prepared by selectively removing an A group element from a precursor MAX-phase material. Depending on the specific MAX being considered, these A group elements may be independently defined as including Al, As, Cd, Ga, Ge, P, Pb, In, S, Si, Sn, or Tl. Some of these A-group elements may be removed in aqueous media, for example, by a process comprising a treatment with a fluorine-containing acid. For example, Al, As, Ga, Ge, In, P, Pb, S, or Sn may be removed in this way, although Al is especially amenable to such extractions. Aqueous hydrofluoric acid is particularly suitable for this purpose, whether used as provided, or generated in situ by other conventional methods. Such methods include the use of any one or more of the following: (a) aqueous ammonium hydrogen fluoride ($NH_4F.HF$); (b) an alkali metal bifluoride salt (i.e., QHF2, where Q is Li, Na, or K), or a combination thereof; or (c) at least one fluoride salt, such as an alkali metal, alkaline earth metal, or ammonium fluoride salt (e.g., LiF, NaF, KF, CsF, $CaF_2$, tetraalkyl ammonium fluoride (e.g., tetrabutyl ammonium fluoride)) in the presence of at least one mineral acid that is stronger than HF (i.e., has a higher Ka value) and can react with fluorides to form HF in situ (such as HCl, HBr, HI, $H_3PO_4$, $HNO_3$, oxalic acid, or $H_2SO_4$); or (d) a combination of two or more of (a)-(c). The use of mixtures of alkali metal or alkailne earth metal salts (typically chlorides or bromides) in combination with HF during the preparation of the MXene materials (e.g., using LiCl, NaCl, KCl, KBr, RbCl, $MgCl_2$, $CaCl_2$) with aqueous HF) provides opportunities for the intercalation of these metal cations (hydrated or otherwise) into the MXene matrices.

In one embodiment, the MXene material is doped with one or more dopants. Exemplary dopants include, but are not limited to, phosphorous, nitrogen, cadmium telluride, cadmium selenide, lithium, vanadium, niobium, tantalum, gold, silver, tellurium, iron, copper, and cerium.

In one embodiment, back contact layer 140 comprises more than one MXene material. Due to their intercompatibility (chemistry, processability), different MXene compositions might be combined to associate their electronic properties.

MXene materials are typically described in terms of single layers or a plurality of stacked layers, wherein at least one of said surfaces of each layer has surface terminations comprising alkoxide, carboxylate, halide, hydroxide, hydride, oxide, sub-oxide, nitride, sub-nitride, sulfide, thiol, or a combination thereof, and such character is confirmed herein. In some embodiments, at least one of said surfaces of each layer has surface terminations comprising alkoxide, fluoride, hydroxide, oxide, sub-oxide, or a combination thereof. In other embodiments, both surfaces of each layer have said surface terminations comprising alkoxide, fluoride, hydroxide, oxide, sub-oxide, or a combination thereof. In other embodiments, one or both surfaces of each layer alternatively or additionally comprises alkoxide, carboxylate, halide, hydroxide, hydride, oxide, sub-oxide, nitride, sub-nitride, sulfide, thiol, or a combination thereof. In one embodiment, one or both surfaces of the MXene material comprises hydroxide, oxide, or sub-oxide functional groups. In other embodiments, one or both surfaces of each layer alternatively or additionally comprises sub-oxides functionalized with organic alkyl, allyl, or aryl ligands.

In independent embodiments, the MXene material can be present and is operable, in virtually any thickness, from the nanometer scale to hundreds of micrometers. Within this range, in some embodiments, the MXene material may be present at a thickness ranging from 1-2 nm to 1000 micrometers, or in a range defined by one or more of the ranges of from 1-2 nm to 25 nm, from 25 nm to 50 nm, from 50 nm to 100 nm, from 100 nm to 150 nm, from 150 nm to 200 nm, from 200 nm to 250 nm, from 250 nm to 500 nm, from 500 nm to 1000 nm, from 1000 nm to 1500 nm, from 1500 nm to 2500 nm, from 2500 nm to 5000 nm, from 5 micrometers to 100 micrometers, from 100 micrometers to 500 micrometers, or from 500 micrometers to 1000 micrometers.

In some embodiments, the MXene material may be transparent or semi-transparent. In one embodiment, the MXene material is opaque to light. In one embodiment, the MXene material is transparent to certain wavelengths of light and is opaque to other wavelengths of light.

Typically, in such coatings, the MXene material is present as an overlapping array of two or more overlapping layers of MXene platelets oriented to be essentially coplanar with the active layer surface. In specific embodiments, the MXene platelets have at least one mean lateral dimension in a range of from about 0.1 micrometers to about 50 micrometers, or in a range defined by one or more of the ranges of from 0.1 to 2 micrometers, from 2 micrometers to 4 micrometers, from 4 micrometers to 6 micrometers, from 6 micrometers to 8 micrometers, from 8 micrometers to 10 micrometers, from 10 micrometers to 20 micrometers, from 20 micrometers to 30 micrometers, from 30 micrometers to 40 micrometers, or from 40 micrometers to 50 micrometers.

Devices contemplated herein employing MXene back contact layers are not limited to the device construction disclosed in FIG. 1. The present invention contemplates any device in which MXene materials are used as a back contact, especially when the MXene materials are used as back contacts for a CdSeTe material or a CdSeTe photovoltaic material. Additional devices may include, but are not limited to, bifacial photovoltaic devices, semitransparent photovoltaic devices, and tandem photovoltaic devices.

Methods of the Invention

Figure 2:
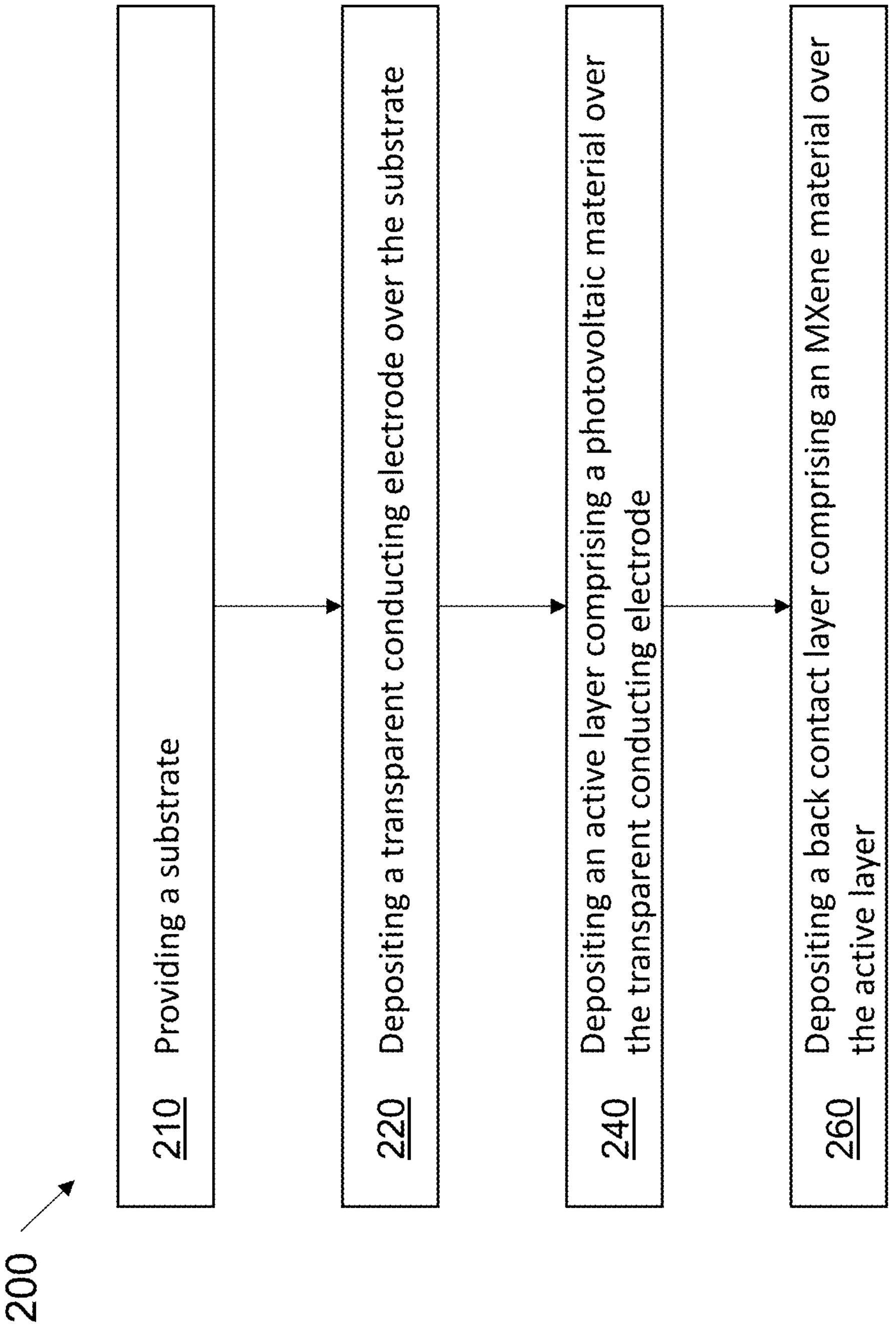
FIG. 2 depicts an exemplary method of the invention.

In another aspect, the present invention relates to a method of producing a photovoltaic device. Exemplary method 200 is presented in FIG. 2, and follows the following key steps. In step 210, a substrate is provided. In step 220, a transparent conducting electrode is deposited over the substrate. In step 240, an active layer comprising a photovoltaic material is deposited over the transparent conducting electrode. In step 260, a back contact layer comprising an MXene material is disposed over the active layer.

The substrate provided in step 210 may comprise any material known in the art. Rigid or flexible substrates may be used. Transparent, semi-transparent, or opaque substrates are considered. Substrate surfaces may be organic, inorganic, or metallic, and comprise metals (Ag, Au, Cu, Pd, Pt) or metalloids; conductive or non-conductive metal oxides (e.g., S1O2, ITO), nitrides, or carbides; semi-conductors (e.g., Si, GaAs, InP); glasses, including silica or boron-based glasses; liquid crystalline materials; or organic polymers. Exemplary substrates include metallized substrates; oxidizes silicon wafers; transparent conducting oxides such as indium tin oxide, fluorine doped tin oxide, aluminum-doped zinc-oxide (AZO), indium-doped cadmium-oxide, or aluminum, gallium or indium-doped zinc oxide (AZO, GZO or IZO). In some embodiments, the substrate is removed following the deposition of any or all subsequent materials.

The transparent conducting electrode may be any transparent conducting electrode discussed herein, and may be deposited using any method known in the art. The photovoltaic layer may be deposited using any method known in the art, and may have any composition known in the art or discussed herein.

The MXene material may be deposited using any method known in the art, including but not limited to layer-by-layer (LbL) assembly, natural sedimentation, rolling, drop-casting, spin-coating, spray-coating, and blade-coating.

In one embodiment of the invention, the MXene material will be deposited in such a manner as to render it semitransparent, allowing light passage through the contact.

Any coating described herein may be patterned or unpatterned on the respective substrate. In independent embodiments, the coatings may be applied or result from the application by spin coating, dip coating, roller coating, compression molding, doctor blading, ink printing, painting or other such methods. Multiple coatings of the same or different MXene compositions may be employed.

Flat surface or surface-patterned substrates can be used. The MXene coatings may also be applied to surfaces having patterned metallic conductors or wires. Additionally, by combining these techniques, it is possible to develop patterned MXene layers by applying a MXene coating to a photoresist layer, either a positive or negative photoresist, photopolymerize the photoresist layer, and develop the photopolymerized photoresist layer. During the developing stage, the portion of the MXene coating adhered to the removable portion of the developed photoresist is removed. Alternatively, or additionally, the MXene coating may be applied first, followed by application, processing, and development of a photoresist layer. By selectively converting the exposed portion of the MXene layer to an oxide using nitric acid, a MXene pattern may be developed. In short, these MXene materials may be used in conjunction with any appropriate series of processing steps associated with thick or thin film processing to produce any of the structures or devices known in the art (including, e.g., plasmonic nanostructures).

In some embodiments of the invention, the MXene material may be subjected to chemical modification prior to or following deposition. Exemplary chemical modifications include, but are not limited to, treatment with acid, base, oxidant, reductant, coupling agent, or plasma.

In some embodiments of the invention, the device at any stage of fabrication may be subject to an annealing process in which the respective layers are subjected to a high temperature. Annealing may be conducted at any temperature, such as temperatures from 100° C. to 2000° C., and any temperature therebetween. Annealing may be conducted under any conditions/atmospheres. In some embodiments, annealing any or all of the layers described herein may tune the surface features of the layer and may enhance cohesion, efficiency, conductivity, stability to various conditions, and/or device lifetime. In some embodiments, annealing of the MXene material may affect the $T_x$ surface modifications. It may be necessary to modulate the annealing temperature so as to tune the surface features of the MXene material. In some embodiments, the MXene material may be subject to any other common treatments known to those of skill in the art.

In one aspect, the present invention relates to a method of generating electricity, the method comprising the step of subjecting a device described herein to any light source, including but not limited to the sun.

EXPERIMENTAL EXAMPLES

The invention is now described with reference to the following Examples. These Examples are provided for the purpose of illustration only, and the invention is not limited to these Examples, but rather encompasses all variations that are evident as a result of the teachings provided herein.

Example 1: MXene Back-Contacts for CdTe PV Devices

Figure 7:
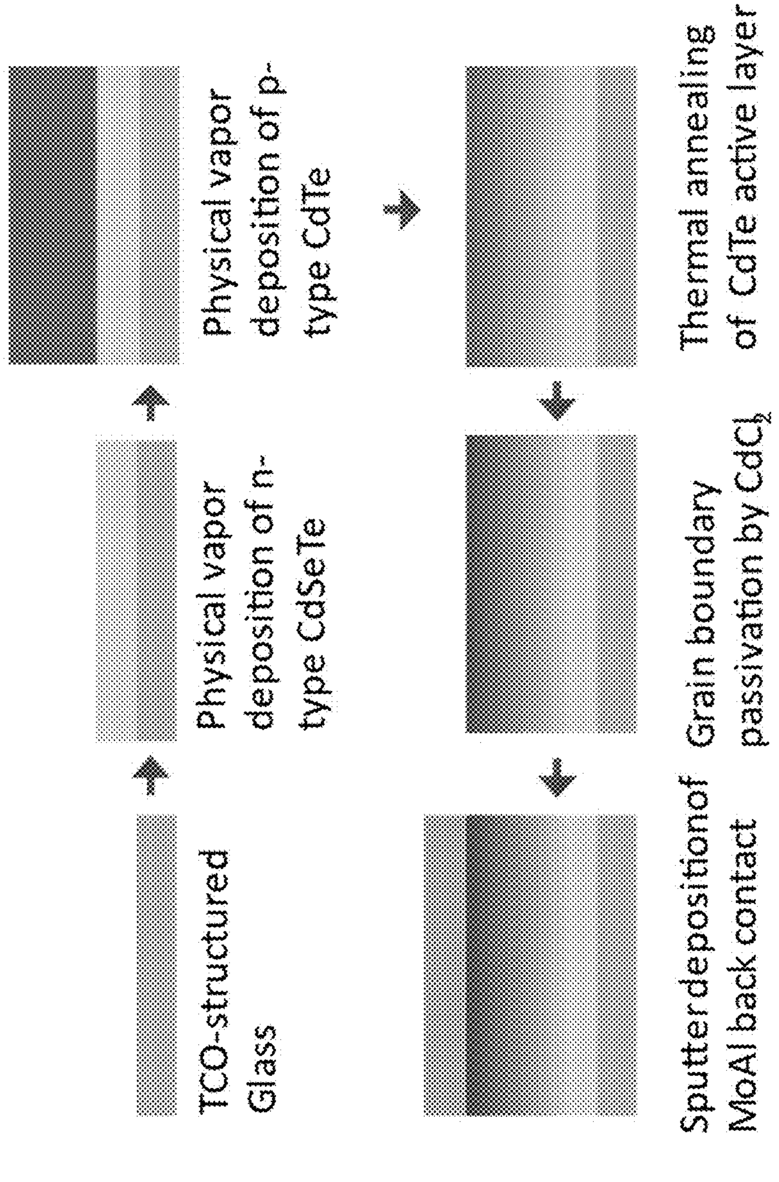
FIG. 7 shows a simplified production line of a CdTe photovoltaic device, including back contact deposition.

Current state-of-the-art back-contact materials are doped or mixed Te-phase semiconducting buffer layers, such as CuTe (Yang, Y. et al. Vacuum 2017, 142, 181-185; Wu, X. et al. Thin Solid Films 2007, 515, 5798-5803) or ZnTe (Uličná, S. et al. Vacuum 2017, 139, 159-163) with high work function metals Mo (Znajdek, K. et al. Opto-Electronics Rev. 2019, 27, 32-38) or Cu operating with work functions ~4.5 eV. Currently, some manufacturers and researchers employ an Mo/Al alloyed back-contact (FIG. 7). Other significant industrial producers use a sputtered ZnTe buffer layer followed by sputtered metallic contacts. By switching to a low-cost and solution-processable back contact with appropriate physical properties, such as high conductivity and deep work function, the price of manufacturing may be brought down while maintaining high efficiency. The replacement of the Mo and Al sputtering steps with a spray-coating step will provide significant reduction to energy, maintenance, and material costs, leading to an immediate reduction in $/kWh.

Figure 3:
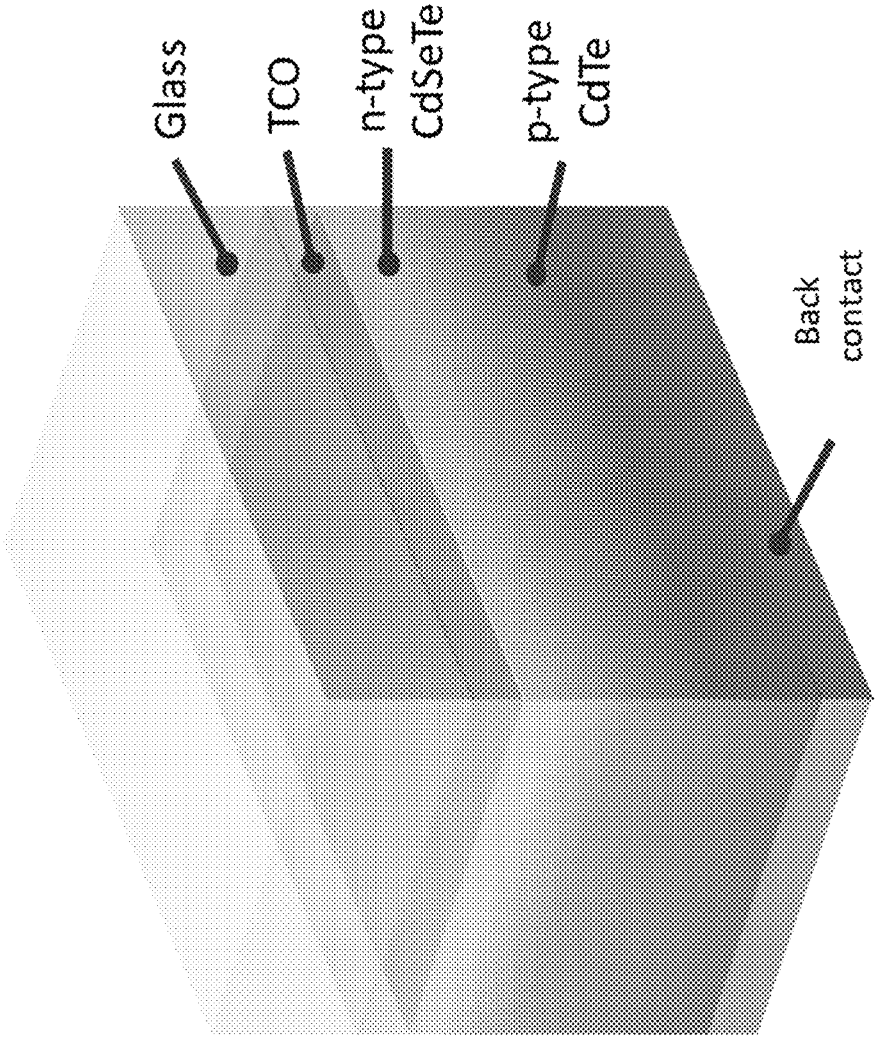
FIG. 3 is a schematic of a typical CdTe stack.
Figure 4:
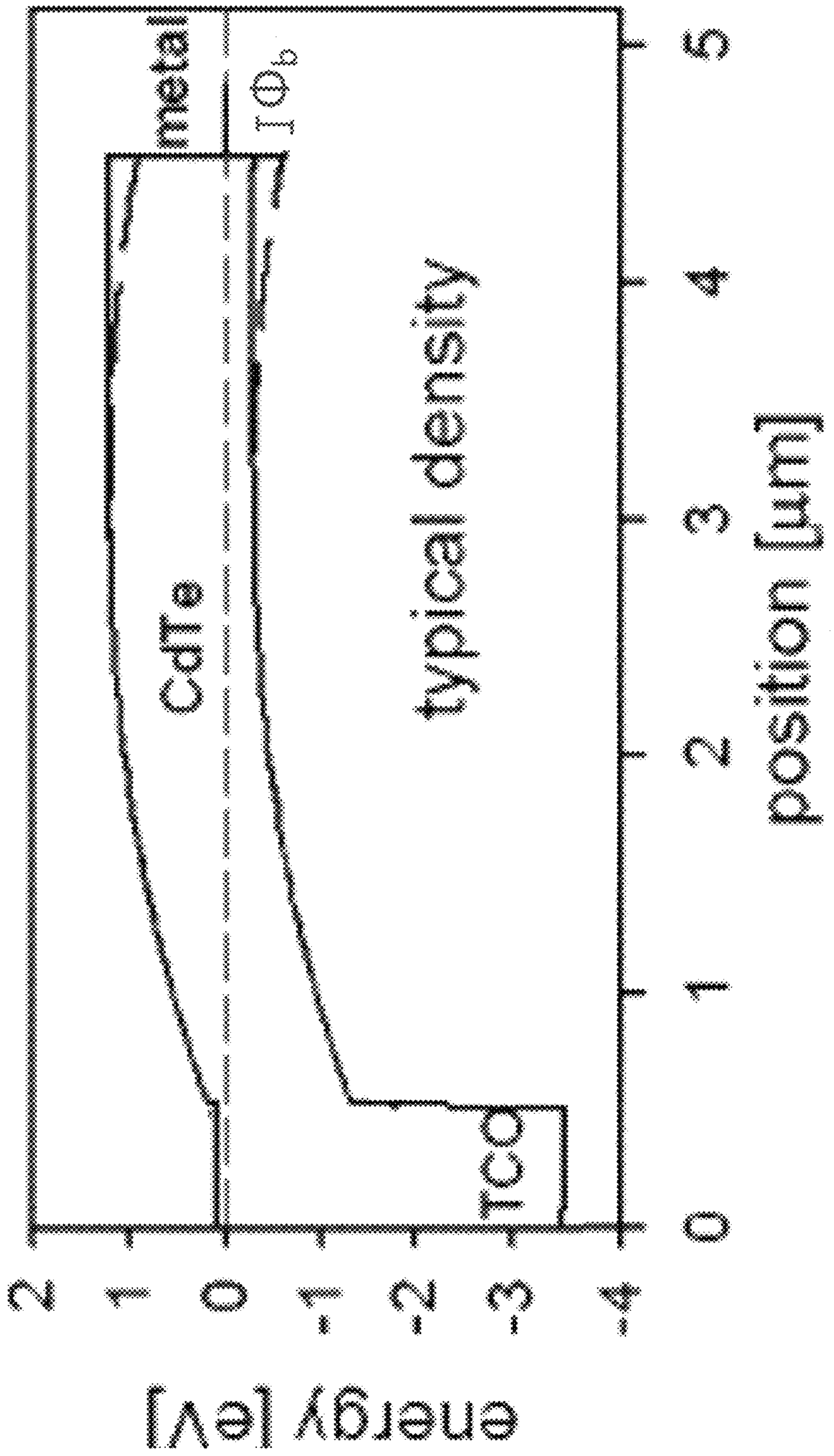
FIG. 4 is a simulated energy-band diagram of CdTe solar cell with contact barrier at 4.5 μm.
Figure 5:
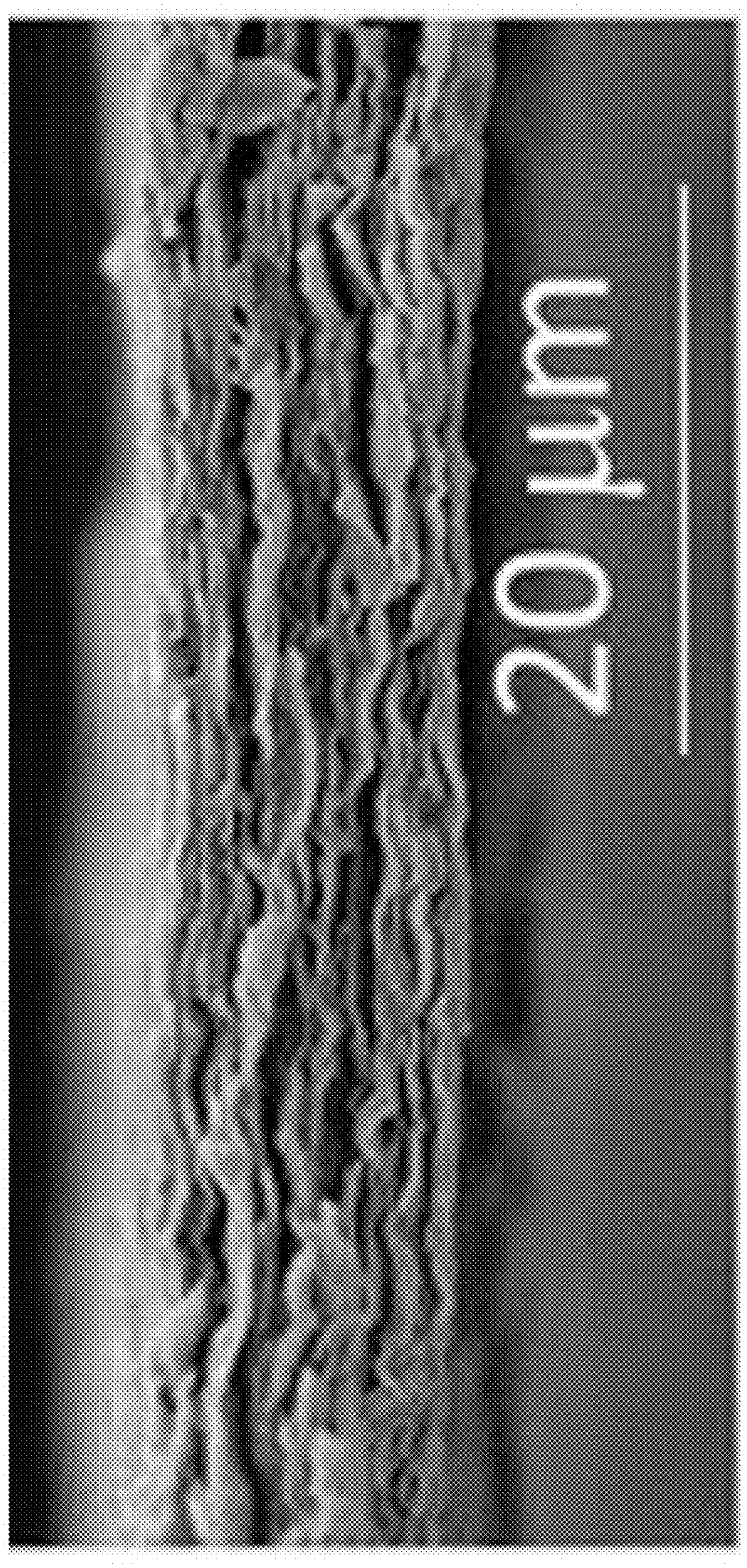
FIG. 5 is a cross-sectional SEM image of a conductive MXene film.
Figure 6:
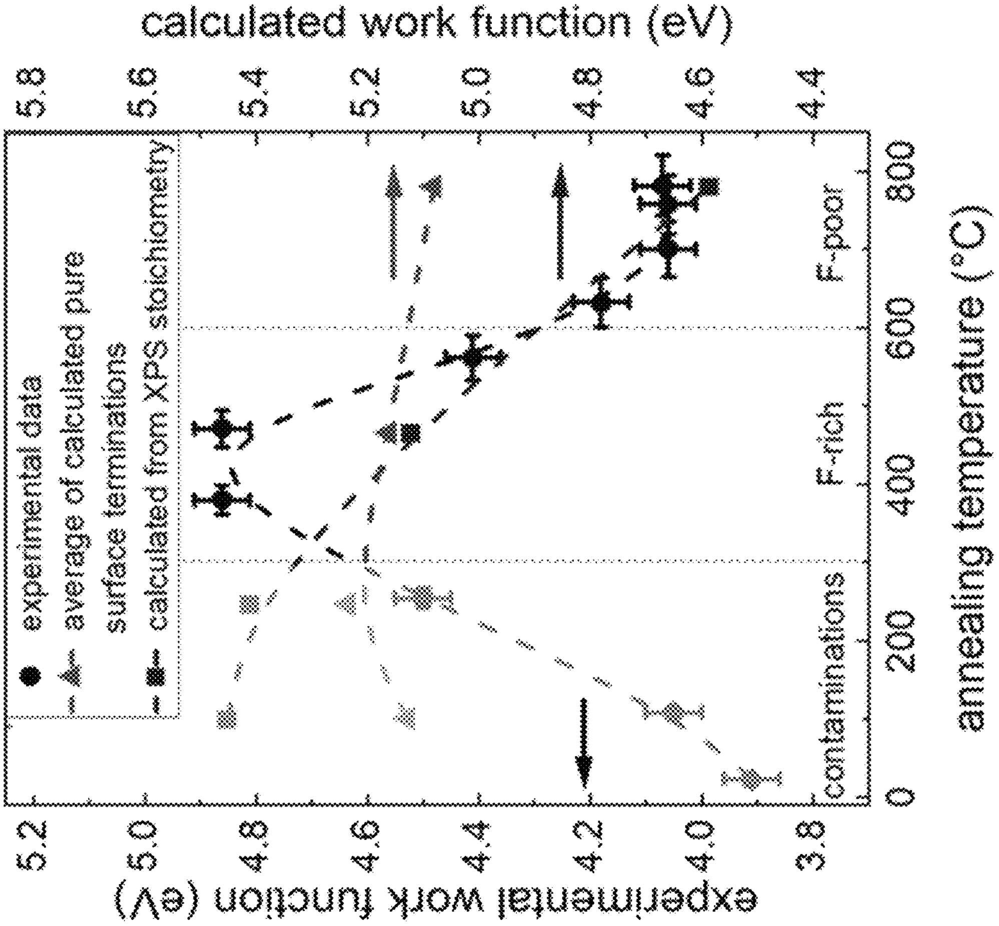
FIG. 6 is a plot of work function of MXenes as a function of annealing temperature (affecting relative concentrations of —O, —OH, and —F surface termination groups).

The expensive, sputtered back contacts for CdTe PVs can be replaced with titanium carbide MXene ($Ti_3C_2T_x$ where $T_x$ represent surface terminations —O, —OH, —F), an emerging class of highly conductive, solution-processable 2D materials (Naguib, M. et al. Adv. Mater. 2011, 23, 4248-4253) (FIG. 3). $Ti_3C_2T_x$ has the highest conductivity of all MXenes prepared to date (15,100 S $cm^{-1}$ for a 214 nm thick film; c.f., Zhang, J. et al. Adv. Mater. 2020, 32, 2001093), and has given outstanding figures of merit in applications such as energy storage (Ghidiu, M., et al., Nature 2014, 516, 78-81; Anasori, B., et al., Nat. Rev. Mater. 2017, 2, 1-17; Lukatskaya, M. R. et al. Science 2013, 341, 1502-1505), transparent conductive electrodes (Mariano, M. et al.

Nanoscale 2016, 8, 16371-16378), electromagnetic interference shielding (Lipton, J. et al. Nanoscale 2019, 11, 20295-20300; Lipton, J. et al., Matter 2020, 3, 335-336; Weng, G.-M. et al. Adv. Funct. Mater. 2018, 28, 1803360; Lipton, J., et al. Matter, 2020, 2, 1148-1165), interlayers for organic solar cells (Yu, Z. et al. J. Mater. Chem. A 2019, 7, 11160-11169) and as back contacts for perovskite solar cells (Agresti, A. et al. Nat. Mater. 2019, 18, 1228-1234). The work function of $Ti_3C_2T_x$ MXenes have been tuned to a level of 5.3 eV by increasing the relative amounts of —O surface terminal groups (Mariano, M. et al. Nanoscale 2016, 8, 16371-16378), demonstrating a work function higher than high work function metals such as Au (5.1 eV). Since CdTe is hydrophilic, and MXenes are processed using water, MXenes form both good ohmic and physical contact with existing CdTe PV architectures (Maleski, K., et al. Chem. Mater. 2017, 29, 1632-1640). Additionally, it has been demonstrated through density-functional theory calculations that increasing the number of —O terminal groups can raise the electrode work function to values as high as 6.25 eV (Liu, Y., et al, J. Am. Chem. Soc. 2016, 138, 15853-15856). MXenes not only lower the cost of manufacturing but also improve the cell efficiency due to Schottky barrier reduction. Finally, manufacturers' production lines often already accommodate spray-coating steps (FIG. 3), so the development of solution-processed MXene electrodes is immediately transferable into production lines.

High efficiency MXene-based back contacts operate at comparable performance to industry standard sputtered metallic back contacts. The improved $V_{oc}$ and fill-factor of the MXene contact observed in J-V characteristics under illumination (FIG. 8) may be attributed to the improved physical properties of the back contact. J-V characteristics in the dark (FIG. 9) further confirm the superior contact performance, noting that the metallic contact exhibits a "rollover" effect, indicating the presence of a performance-limiting Schottky diode at the back interface.

Figure 8:
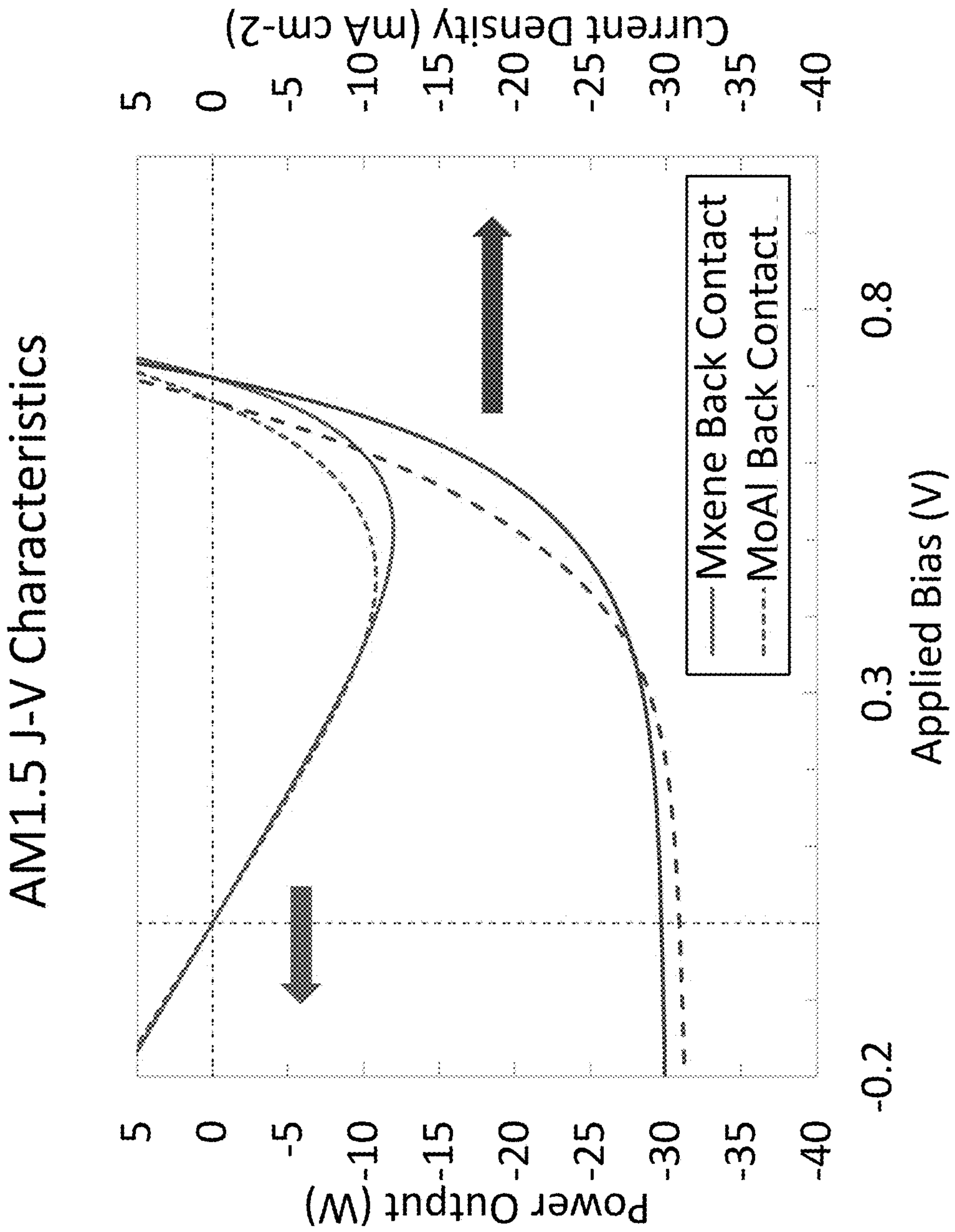
FIG. 8 is a plot of CdTe photovoltaics J-V behavior under AM1.5G illumination.

CdTe photovoltaics J-V behavior under AM1.5G illumination are shown in FIG. 8. Identical active layers and device configurations were used, with the only difference in the device being the applied back contact. The MoAl back contact is a standard industry sputtered metallic contact and the MXene back contact is a blade-coated 2.4Ω/□ $Ti_3C_2T_x$ back contact applied following Cu-doping of the back interface. The MXene contacted device demonstrates a higher device power output (Table 1).

TABLE 1

| | Back Contact | |
|---|---|---|
| Device | Mo | MXene |
| PCE (%) | 10.817 | 11.963 |
| Voc (V) | 0.677 | 0.715 |
| Jsc (mA/cm$^2$) | −30.897 | −29.704 |
| FF (%) | 51.70% | 56.30% |
| Area (mm$^2$) | 12.8 | 10.1 |

Figure 9:
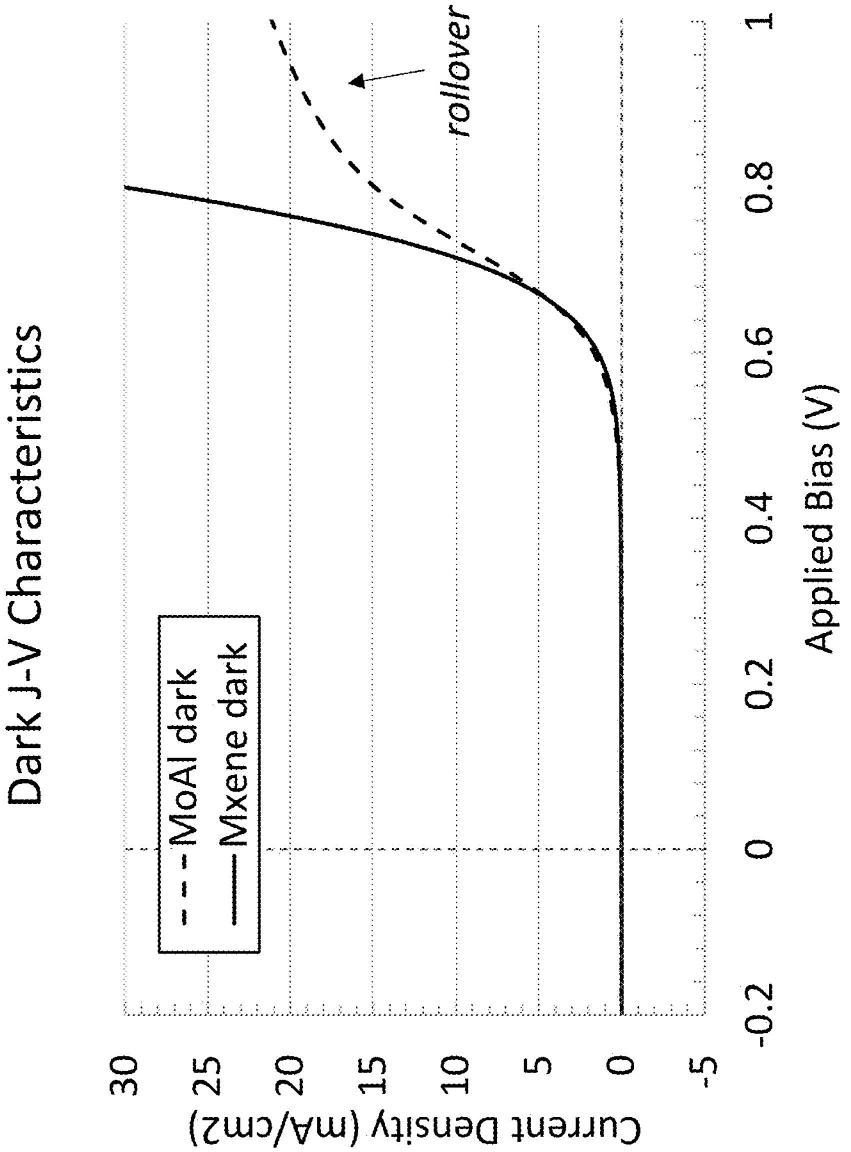
FIG. 9 is a plot of CdTe photovoltaics J-V behavior in dark.
Figure 10:
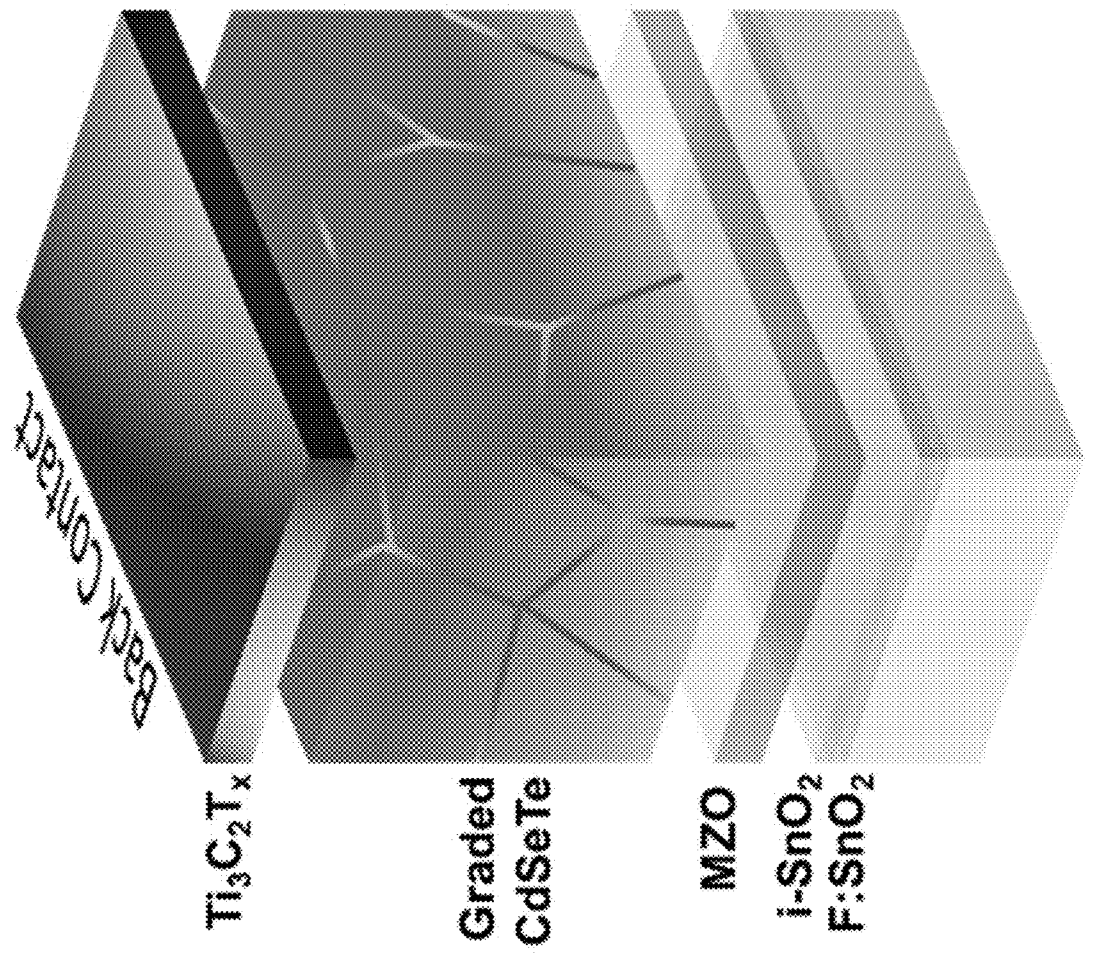
FIG. 10 depicts a CdTe photovoltaic device stack; glass/$SnO_2$/Mg:ZnO (MZO)/CdSeTe/$Ti_3C_2T_x$.

CdTe photovoltaics J-V behavior in dark are presented in FIG. 9. The molybdenum device demonstrates considerable "rollover" effect, which is indicative of the formation of a Schottky barrier at the back interface. The MXene maintains more ideal diode behavior, indicating that no detectable barrier has formed. This barrier reduces Vo, and fill-factor of the device under illumination as seen in Table 1.

Given the rapid development of this contact, and the potential to further increase the work function of MXenes through pre- and post-processing of the MXene thin-films, the contact can be further improved beyond even the current performance. This concept has the potential to become the state-of-the-art back contact processing method for CdTe photovoltaics.

Figure 11:
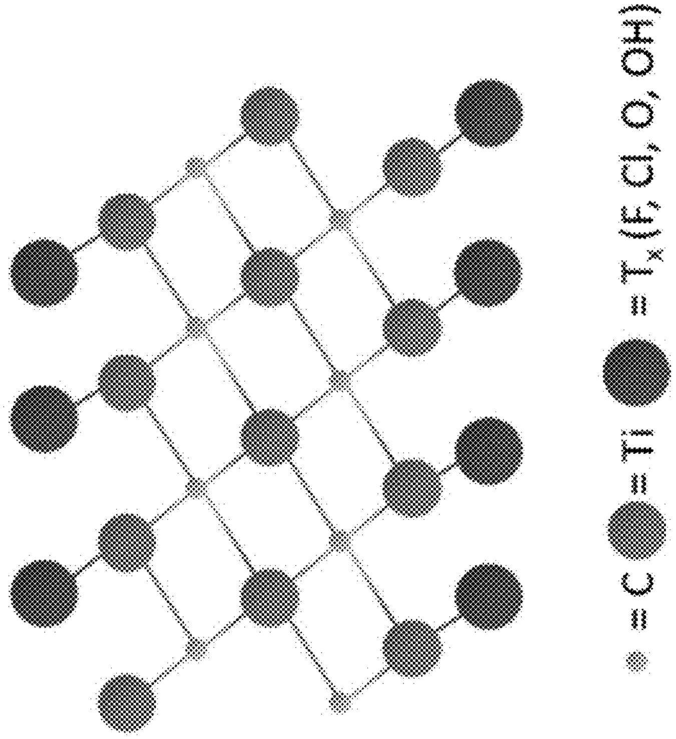
FIG. 11 depicts an exemplary $Ti_3C_2Tx$ MXene structure. Surface terminations ($T_x$) occupy the bridge or top-sites of the flake surface.
Figure 13:
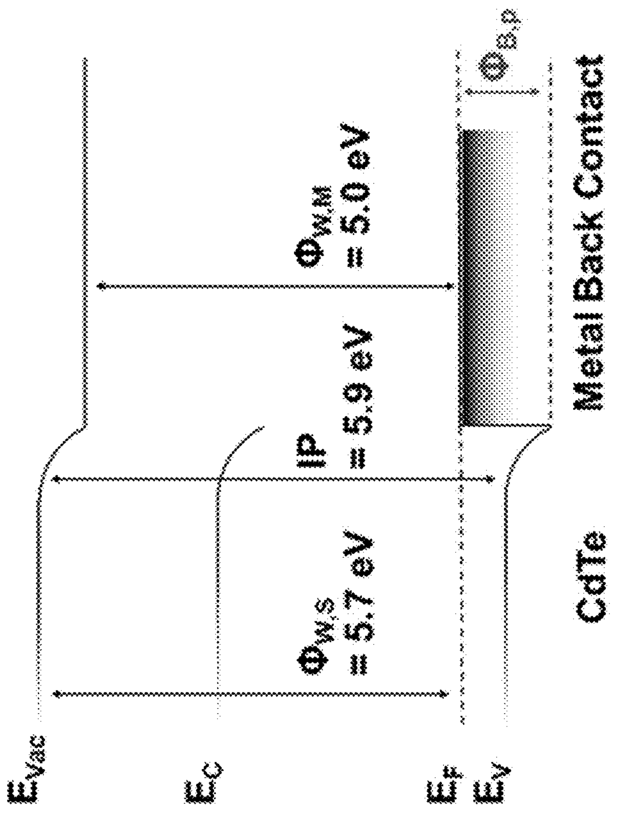
FIG. 13 is an energy band diagram following electrical contact and equilibration, demonstrating the formation of a back contact Schottky barrier ($\Phi_{B,p}$).
Figure 12:
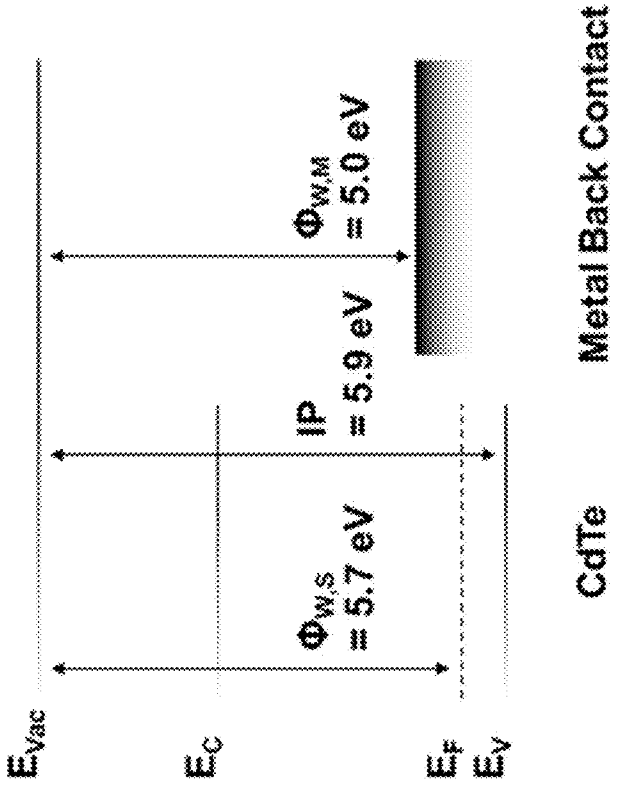
FIG. 12 is an energy band diagram of the CdTe back interface before electrical contact with a metallic back contact.
Figure 15:
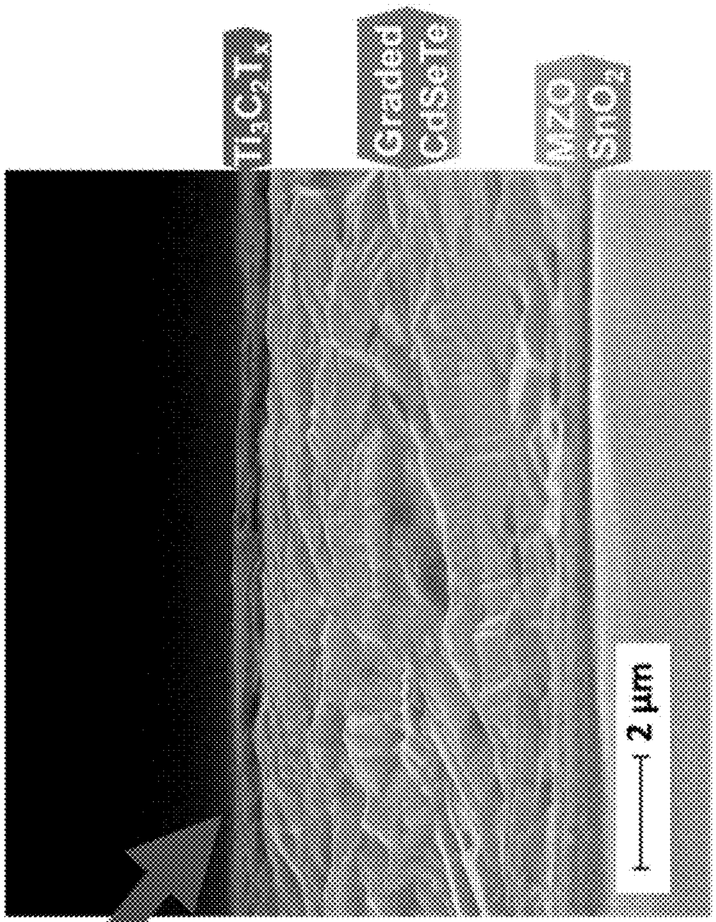
FIG. 15 is a cross-sectional SEM image of a CdTe device following room-temperature cleaving. False coloring is added to delineate the various layers of the device.
Figure 14:
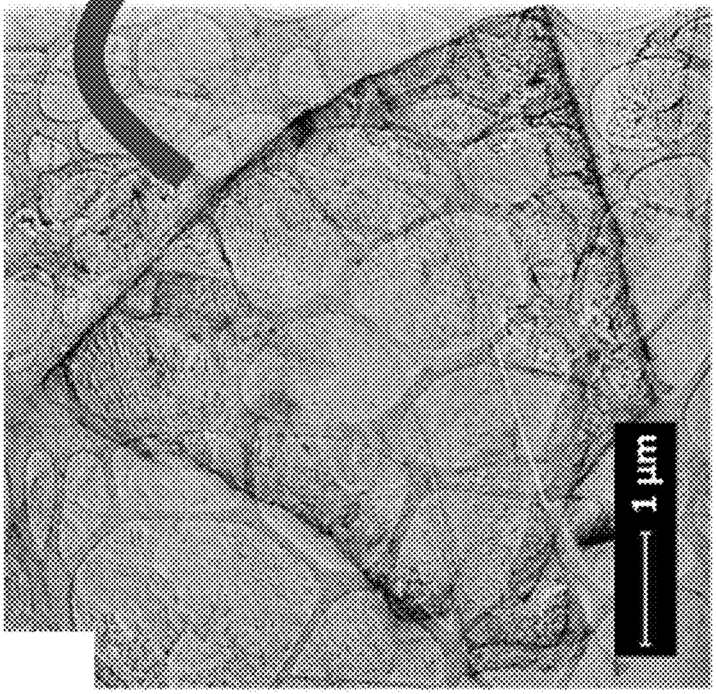
FIG. 14 is a Transmission Electron Microscopy (TEM) image of a single $Ti_3C_2T_x$ flake.

Example 2: Development of Titanium Carbide MXene Hole Contacts for CdTe Photovoltaics MXenes are a family of two-dimensional (2D) materials that have garnered substantial scientific interest (Naguib, M. et al. *Advanced Materials* 23, 4248-4253 (2011)); Gogotsi, & Anasori, *ACS Nano* 13, 8491-8494 (2019); Naguib, et al. *Advanced Materials* 26, 992-1005 (2014)). MXenes have the general formula $M_nX_{n-1}T_x$. where M is an early-stage transition metal, X is carbon or nitrogen, and $T_x$ represents surface terminations such as —O, —OH, —F, and —Cl which arise from synthesis and post-processing conditions (Seredych, M. et al. *Chem. Mater.* 31, 3324-3332 (2019)) (FIG. 11 and FIG. 14). To date, there are more than 30 different MXenes that have been successfully synthesized, with more than 100 MXenes predicted theoretically. MXenes have a unique combination of physicochemical properties which include high conductivity (Mathis, T. S. et al. ACS Nano 15, 6420-6429 (2021)), simple solution-processing from benign solvents (Lipton, et al., Matter 2, 1148-1165 (2020); Lipton, J. et al. Matter 3, 546-557 (2020)), and a tunable work-function through selection and manipulation of flake surface terminations (Kamysbayev, V. et al. Science 369, 979-983 (2020)). MXenes have demonstrated a broad versatility, finding applications in energy storage, electronics, medical devices, and beyond (Vahid-Mohammadi, A., Rosen, J. & Gogotsi, Y. The world of two-dimensional carbides and nitrides (MXenes). Science 372, (2021)). Notably, they have found applications in silicon, organic and perovskite photovoltaics as additives, charge transport layers, and contacts (Yin, L. et al. Nano-Micro Lett. 13, 78 (2021)); however, there has been no report of the use of MXenes in CdTe literature.

$Ti_3C_2T_x$ MXene back contacts for CdTe PV result in highly efficient solar cells (14.8±0.6% PCE) with reduced back contact barrier heights. MXenes have several key characteristics that make them ideal back contact candidates for CdTe. The high work function of MXene flakes (4.95 eV) enables the formation of low-barrier hole contacts (0.33 eV) and the high conductivity (low sheet resistance) of MXene thin films (2.4Ω/□) allows for a subsequent metallization step to be skipped entirely. Simple deposition from benign solvents, in this case water, is transferable to high throughput processing methods commonly used in CdTe PV production lines. The results reported herein confirm that MXenes offer a promising solution-processable platform for realizing low-cost, efficient contacts to CdTe.

Materials and Methods

Superstrate CdTe device stacks were fabricated using thermal evaporation. Briefly, devices were grown on 3" x 3" commercially-available Pilkington Tec-12D substrates. Then 500 nm of CdSeTe alloy (30% Se content) and 3 μm CdTe were thermally evaporated while holding the substrate at 450° C. The film was then exposed to $CdCl_2$ vapor at 435° C. for 10 min in a 400 Torr He environment. Then, Cu was introduced via dipping the substrates in aqueous 0.1 mM $CuCl_2$ for 3 min and annealing in a tube furnace at 210° C. in laboratory air ambient. Each 3"×3" substrate was then cut into 16 pieces and a device area of 0.25 cm$^2$ was defined using a mask. $Ti_3C_2T_x$ films were then applied to the completed CdTe device stack by drop-casting 25 μL of aqueous solution containing 3 mg $mL^{-1}$ of dispersed $Ti_3C_2T_x$ flakes onto the 0.25 $cm^2$ active area. The film was then left in a nitrogen-purged dry-box to air-dry overnight. The resulting MXene film thickness was 1 µm. The final device structure is shown in FIG. 11 and FIG. 14. 0.25 $cm^2$ Gold control devices were fabricated by evaporating 100 nm of gold at a rate of 2 Å/s through a shadow mask using thermal evaporation under high vacuum ($10^{-7}$ Torr).

Current density-voltage (JV) measurements were conducted using a Keithley 2400 SMU from −0.2 V to 1 V in both the dark and under illumination. The devices were illuminated under AM1.5G (1 sun; p=100 mW $cm^{-2}$) using a VeraSol-2 LED Class AAA Solar Simulator. External quantum efficiency (EQE) measurements were conducted using a Newport Quantum Efficiency apparatus illuminated by a Xenon light source and recorded from 300 to 1100 nm using a monochromator. Kelvin-probe Force Microscopy (KPFM) measurements were made on a Bruker Icon AFM. The tip work function was calibrated against freshly cleaved highly-oriented pyrolytic graphite (HOPG). Sheet resistance measurements were conducted using a 4-point probe setup connected to a Keithley 2400 SMU. Temperature-dependent current density-voltage measurements (JVT) were conducted on a custom apparatus illuminated by a xenon lamp and measured between 300K and 150K. Transmission electron microscopy (TEM) images were taken using an FEI Titan Themis 200 using a 180 kV accelerating voltage. Scanning electron microscopy images were taken using a Zeiss Merlin FESEM at an accelerating voltage of 3 kV and a working distance of 3.6 mm.

Figure 16:
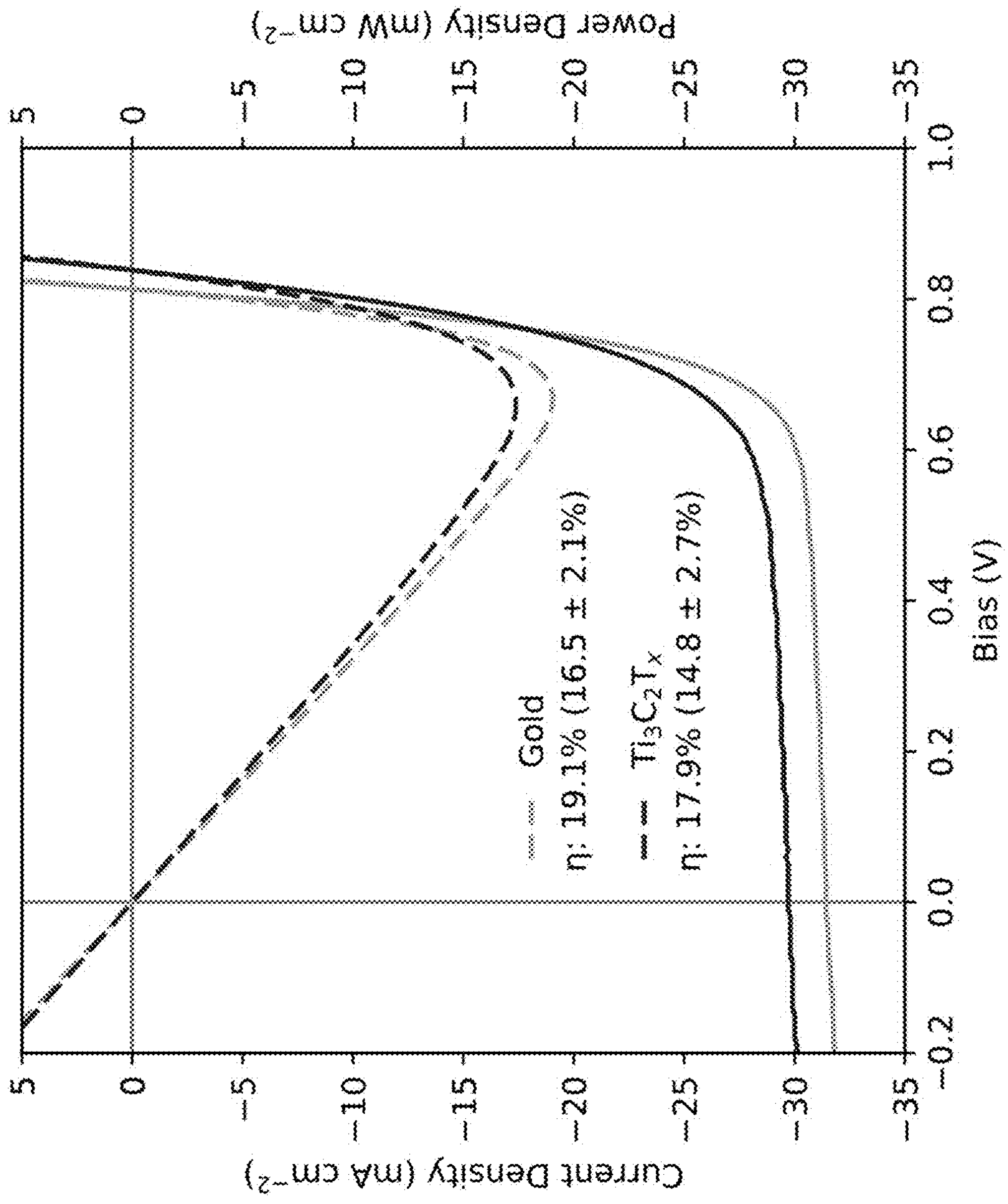
FIG. 16 is a plot of pV and JV behavior of champion gold- and $Ti_3C_2T_x$-contacted CdTe devices.

The performance of $Ti_3C_2T_x$-contacted devices and gold-contacted devices was investigated using JV measurements (FIG. 16). Remarkably, the champion $Ti_3C_2T_x$-contacted device yielded an average efficiency of 17.9%, a 94% of the efficiency of the 19.1% efficient gold controls. On average, the $Ti_3C_2T_x$-contacted devices have a similar $V_{OC}$ and short circuit current ($J_{SC}$) to the gold controls but yield a slightly lower FF, resulting in the slightly lower efficiency. The resulting high-efficiency devices with $Ti_3C_2T_x$ contacts yield comparable or better efficiencies than many contemporary back contact candidates that have been investigated (Hall, *Energy Sci. Eng.* doi:10.1002/ese3.843).

$$\eta = \frac{J_{SC} V_{OC} FF}{100\,\mathrm{mWcm}^{-2}} \times 100\% \qquad (1)$$

The slight discrepancy between $J_{sc}$ from EQE and JV measurements may be due to differences in light intensity, although the trends between devices remain consistent across measurements. $J_{sc}$,EQE is measured for champion efficiency devices.

Series resistance, as determined by the slope of the JV curve at $V_{OC}$, is slightly higher for the $Ti_3C_2T_x$-contacted device (4.06Ω) compared with the gold-contacted device (3.61Ω), contributing to the slight decrease in FF. Given the variability in absorber layer fabrication and quality across different research groups, it is difficult to draw direct comparison with other back-contact technologies, but the high performance of $Ti_3C_2T_x$-contacted devices suggests that the highly tunable MXene family of materials offers a promising platform for improving device efficiencies through manipulation of the back interface.

Carrier recombination rates were probed in completed devices by time-resolved photoluminescence (TRPL). Using a 670 nm laser, the bulk recombination rate was probed for both gold- and $Ti_3C_2T_x$-contacted devices. While there was significant spread in the photoluminescence lifetime across each set of devices, $\tau_2$ lifetimes as determined by a biexponential fit of the deconvoluted signal are consistent (Table 1). This spread may be the result of variable selenium grading across devices in the same set, a parameter that has been shown to be a key parameter for the manipulation of $\tau_2$.

TABLE 1

Device parameters for $Ti_3C_2T_x$- and Gold-contacted devices (16 devices each).

| Device | Efficiency (%) | $V_{OC}$ (mV) | FF (%) | $J_{sc,JV}$ (mA $cm^{-2}$) | τ2 (ns) | $J_{sc,EQE}$ (mA $cm^{-2}$) |
|---|---|---|---|---|---|---|
| $Ti_3C_2T_x$ | 17.1 ± 0.6(17.9) | 804 ± 9 | 70.6 ± 1.9 | 30.1 ± 0.2 | 6.86 ± 2.6 | 26.7 |
| Gold | 18.1 ± 0.4(19.1) | 812 ± 12 | 72 ± 1.1 | 30.8 ± 0.6 | 27.5 ± 26.9 | 28.7 |

Figure 17:
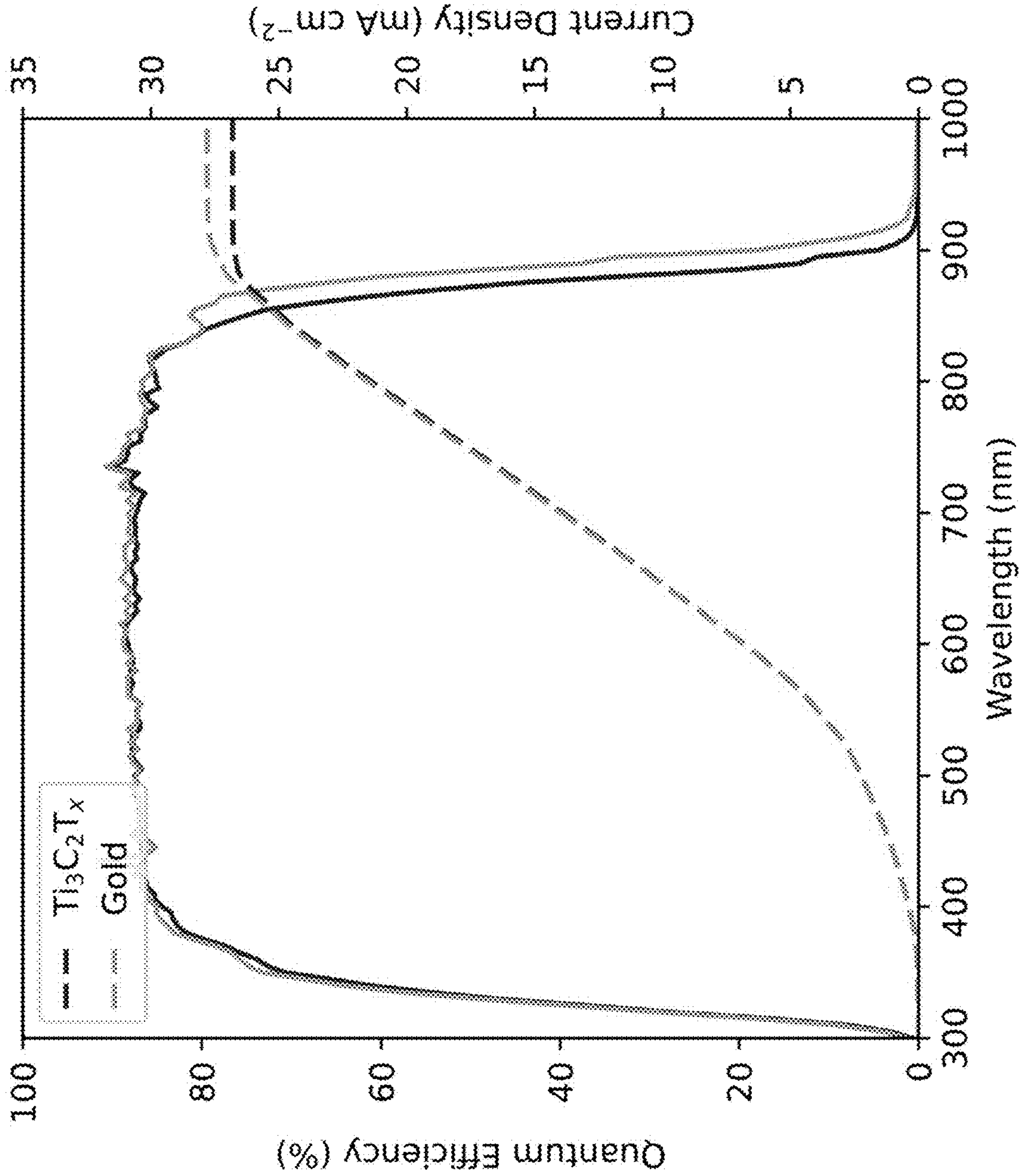
FIG. 17 is a plot of EQE and integrated $J_{SC}$ for champion devices.
Figure 18:
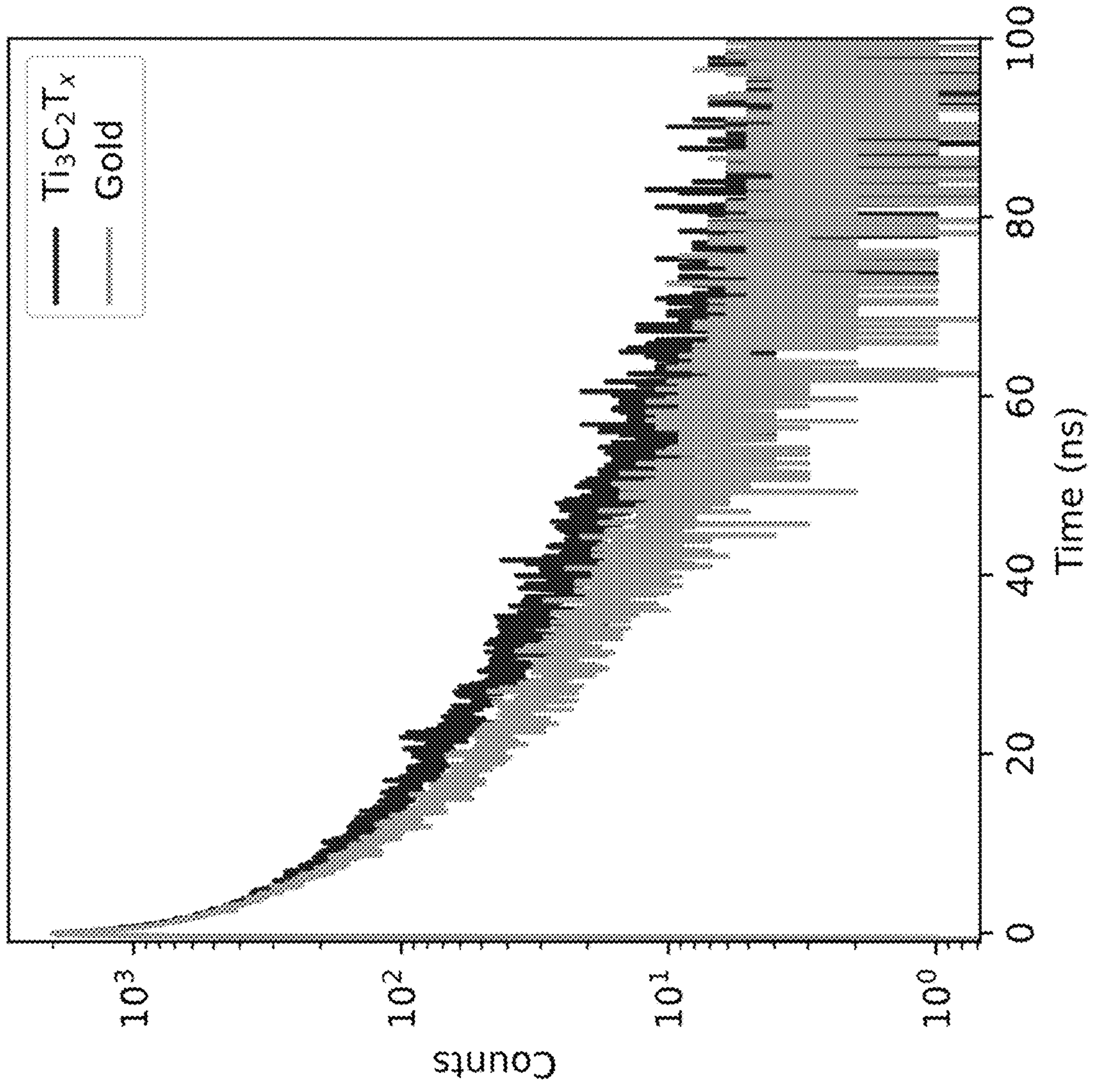
FIG. 18 is a plot of by time-resolved photoluminescence (TRPL) measurements for champion devices.
Figure 20:
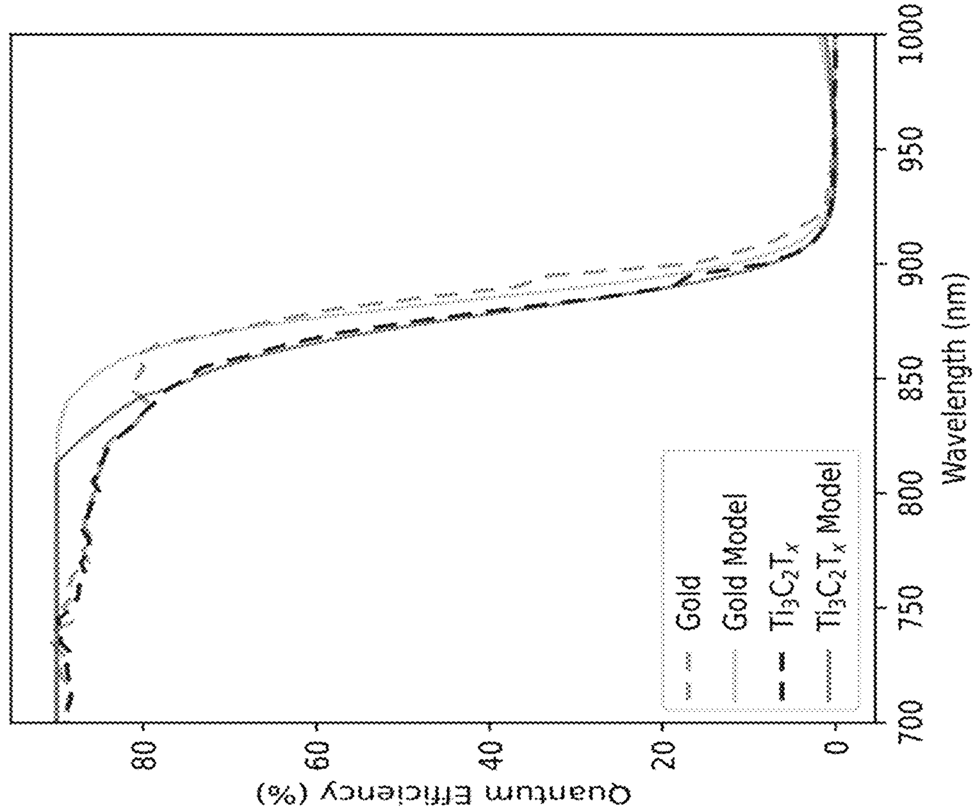
FIG. 20 is a plot of experimental $Ti_3C_2T_x$ and gold external quantum efficiency spectra (dashed) and models incorporating reflection off the back contact (solid). In these models, a second pass through the CdSeTe layer based on the reflection off the back contact duplicates the observed EQE response and consequently lower $J_{sc}$.
Figure 19:
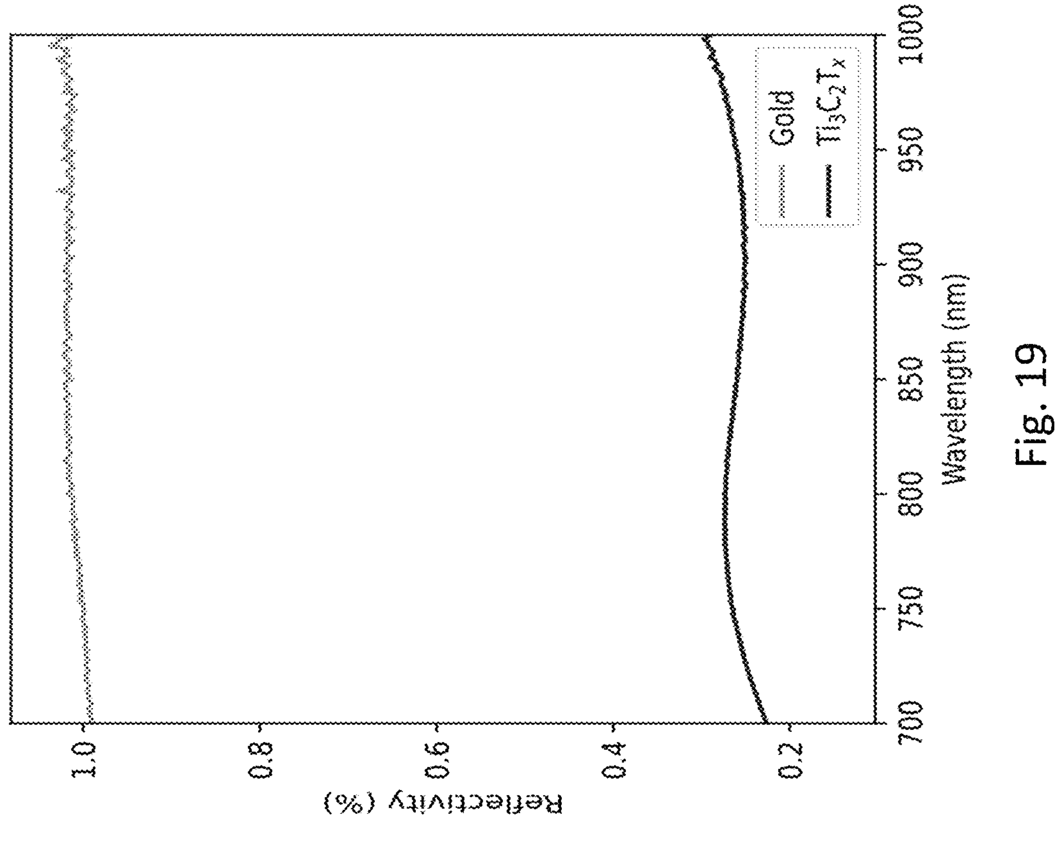
FIG. 19 is a plot of the reflectivity data for neat $Ti_3C_2T_x$ and gold films.

The slight discrepancy between $J_{sc}$ from EQE and JV measurements may be due to differences in light intensity, although the trends between devices remain consistent across measurements. $J_{sc}$,EQE is measured for champion efficiency devices, EQE measurements show nearly identical quantum efficiency for $Ti_3C_2T_x$ and gold devices from 300 nm to 850 nm, with deviation only occurring at around 850 nm, the region of the measurement typically associated with the absorption onset of graded CdSeTe (FIG. 17). The bandgap of each device due to this selenium grading is determined by fitting around the inflection point of the absorption onset in the quantum efficiency measurement, according to previously described procedures (Helmers, et al. *Appl. Phys. Lett.* 103, 032108 (2013)). The fit of these curves suggests a slight difference in the band-gap grading for each device. However, this photoresponse is also modulated by reflection of the NIR photons off the back contact, and subsequent light trapping, as not all light is absorbed upon the first pass-through of the relatively thin CdSeTe layer. The reflectance of gold in this region of the spectrum is near unity, while in $Ti_3C_2T_x$ devices the reflectance is around 20% (FIG. 19). By modelling the absorption of two passes through a 450 nm 30% CdSeTe layer (McGott, et al. IEEE Journal of Photovoltaics 12, 309-315 (2022)) (one by incident light, and one by reflected light), the result obtained from device quantum efficiencies may be neatly replicated (FIG. 20). Thus, strategies to raise NIR reflectance at the MXene/CdTe interface may prove effective for improving device photocurrent. This plasmonic feature may be shifted by modifying the surface termination groups or by using different MXenes, such as $Ti_2CTx$ or V2CTx. (Maleski, et al. Advanced Optical Materials 9, 2001563 (2021)) It should be noted that while a 500 nm CdSeTe layer was deposited during device fabrication, the subsequent grading of Se during the CdTe treatment would effectively decrease the absorption in this layer, giving a comparable absorption to a thinned CdSeTe layer. Notably, in devices fabricated with a CdS window layer, the reduction in back contact reflectivity would not have a substantial effect on the short-circuit current as these shorter wavelengths are not typically absorbed, and we would expect devices with identical photoresponse.

Figure 21:
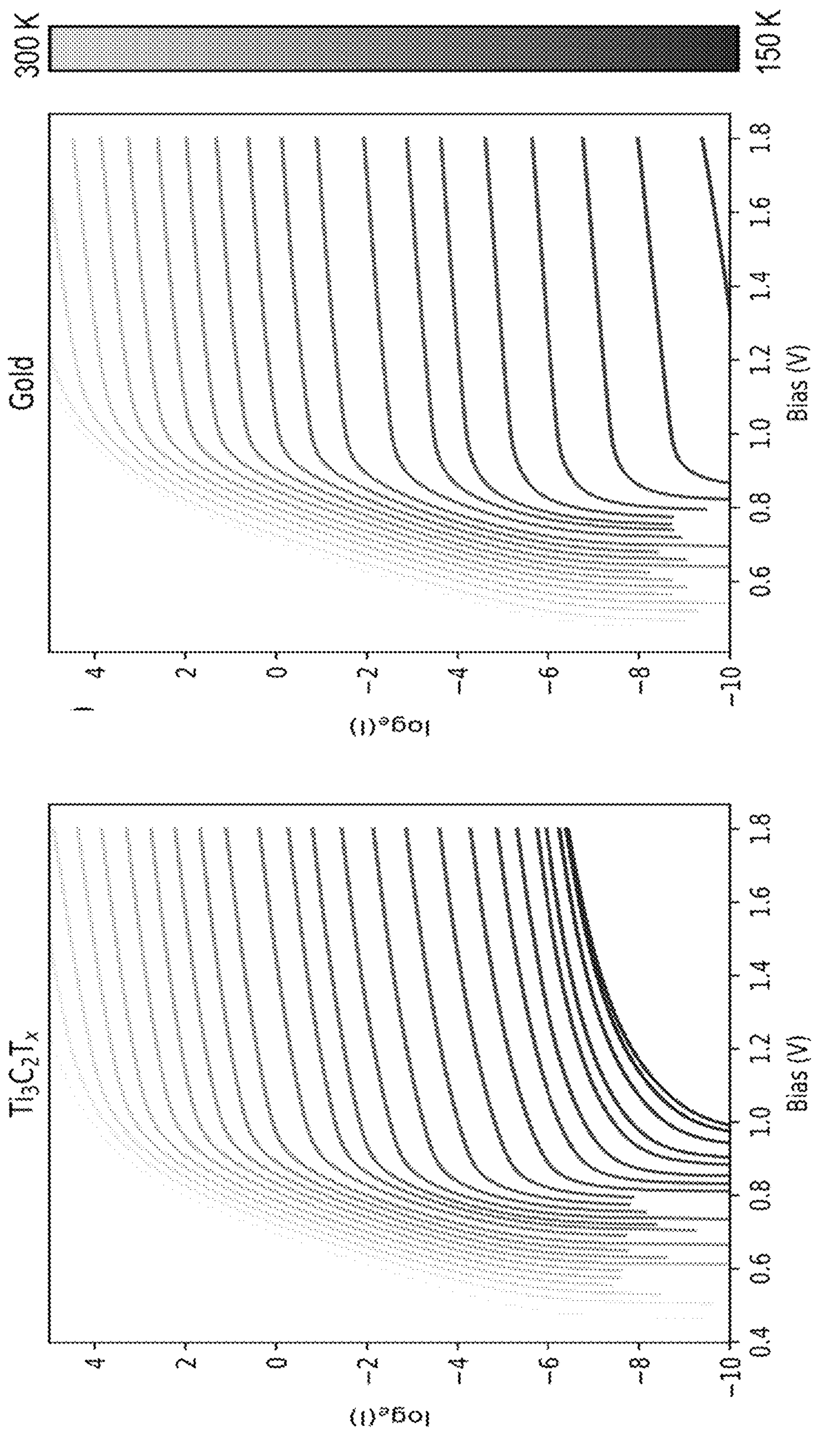
FIG. 21 depicts plots of JV(T) data for $Ti_3C_2T_x$- and gold-contacted CdTe devices. Log(I) vs. V is plotted for temperatures ranging from 300K to 150K to accentuate the pronounced "roll-over" effect that appears at higher biases. As the temperature decreases, the current-limiting effect of the back contact barrier reduces the final current ($J_{0,b}$).
Figure 22:
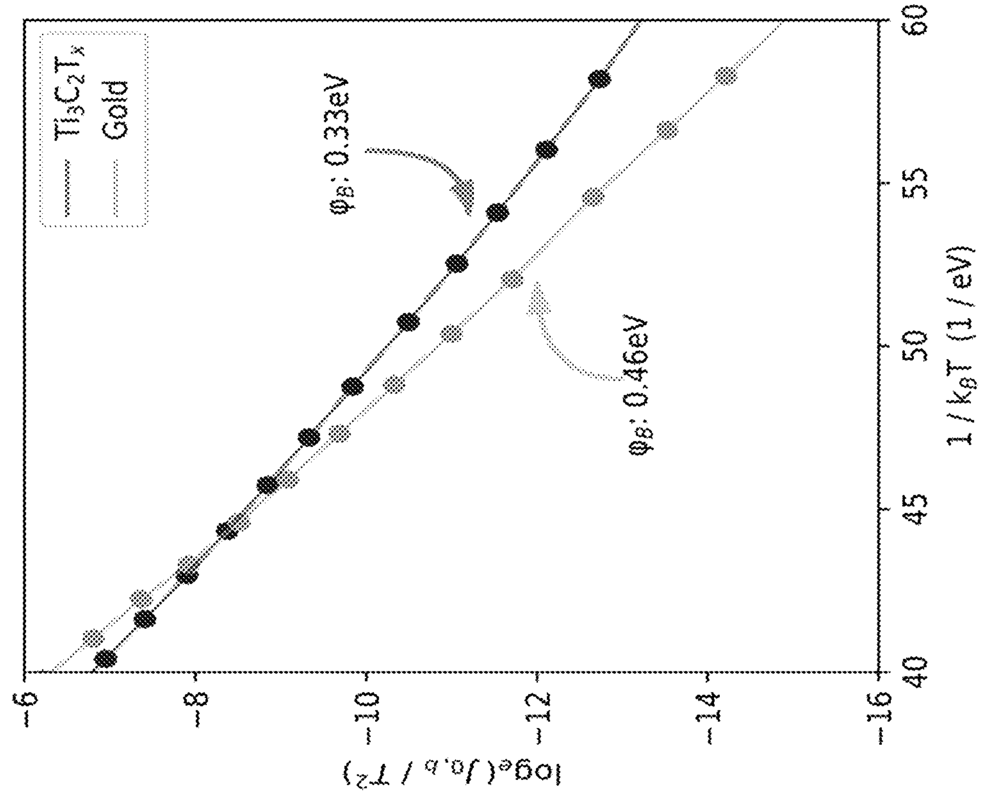
FIG. 22 is an Arrhenius plot of $\log_e(J_{0,b}T^{-2})$ vs. 1/kT to extract back contact barrier height from JV(T) data. The resulting analysis shows a lower barrier height for $Ti_3C_2T_x$.

KPFM was conducted on neat MXene films to evaluate the work function of MXene back contacts. KPFM results yielded a work function of 4.95 eV for MXene films, significantly lower than the valence band edge of CdTe, which is expected to be ~5.8 eV. The back contact barrier height was probed using temperature-dependent current-voltage (JVT) measurements (FIG. 21). By measuring the current response at forward bias, a temperature dependent "rollover" effect is observed, characteristic of a rectifying back contact barrier ($\phi_b$). The current at which the measurement saturates ($J_{0,b}$) in forward bias is related to the barrier height by Equation 2:

$$J_{0,b} = A^* T^2 e^{-\frac{q\phi_b}{kT}} \tag{2}$$

where A* is the effective Richardson constant, q the fundamental charge, and k the Boltzman constant. By plotting the logarithm of $J_{0,b}T^{-2}$ vs. 1/kT, an Arrhenius plot may be constructed in which the back contact barrier height may be extracted from the slope (FIG. 22) (Demtsu, et al., Thin Solid Films 510, 320-324 (2006)). This analysis yields a barrier height of 0.33 eV for a $Ti_3C_2T_x$-contacted device, and 0.45 eV for a gold-contacted device. The measured barrier height for gold is typical for barrier heights measured by JV(T) or cyclic voltammetry. The relatively low contact barrier for the $Ti_3C_2T_x$ contact is a surprising result given the measured work function. It may be that the interaction between the two-dimensional $Ti_3C_2T_x$ flakes and the surface states of the CdTe is different from the interaction between thermally deposited gold, but the nature of these interactions is outside the scope of this report.

Figure 23:
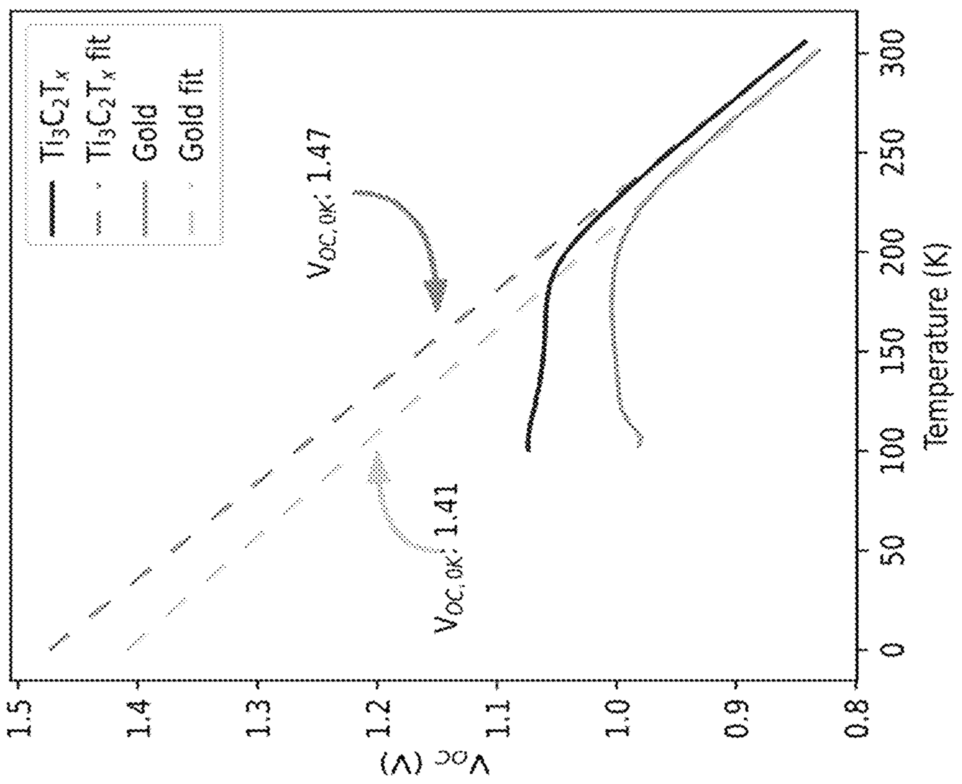
FIG. 23 is a plot of $V_{oc}$(T) data for gold and $Ti_3C_2T_x$-contacted devices, demonstrating smaller voltage loss for the latter.

$V_{OC}$ vs temperature measurements (FIG. 23) yield insight into the dominant recombination processes occurring in a given device (Mia, M. D. et al. Journal of Vacuum Science & Technology B 36, 052904 (2018)). Extrapolation of the $V_{OC}$ to 0 K, in the absence of high rates of interfacial recombination, should approach the open-circuit voltage limited by bulk recombination. For CdSeTe devices, this value is ~1.5 eV, with a dependency on the Se content. The gold-contacted device suffers from a 60 meV voltage deficit as compared to the $Ti_3C_2T_x$-contacted device. Band-gap determination by fitting the absorption onsets confirm that these devices have near identical bandgaps (within 20 meV), suggesting that this voltage deficit occurs due to differences in interfacial properties, namely interfacial recombination and Schottky barrier height, rather than a difference in bandgap grading.

In conclusion, $Ti_3C_2T_x$ MXenes are effective, solution-processable CdTe back contacts. The high work function of $Ti_3C_2T_x$ MXenes allows for low Schottky-barrier hole contacts to be made with CdTe surfaces. This has excellent implications for future CdTe devices, as a lower barrier height allows for the fabrication of CdTe devices with thinner active layers and raises the efficiency ceiling on CdTe devices as carrier concentration and front interface recombination are improved. The promising results using $Ti_3C_2T_x$, the prototypical and most-studied MXene, suggest that the MXene family of materials may yield a rich vein of research for the formation of effective CdTe back contacts. The use of high work function MXenes, such as $Mo_2CT_x$ or $V_4C_3T_x$ may further lower contact barriers or even enable ohmic contacts with CdTe, further improving $V_{OC}$ and FF. In addition, increasing the reflectivity of MXenes through to manipulation of the plasmonic peak position may yield further improvement to $J_{sc}$ for $Ti_3C_2T_x$-contacted devices.

The disclosures of each and every patent, patent application, and publication cited herein are hereby incorporated herein by reference in their entirety. While this invention has been disclosed with reference to specific embodiments, it is apparent that other embodiments and variations of this invention may be devised by others skilled in the art without departing from the true spirit and scope of the invention. The appended claims are intended to be construed to include all such embodiments and equivalent variations.

We claim:

1. A photovoltaic device comprising:

a transparent conducting electrode layer;

an n-type layer comprising an n-type photovoltaic material;

a p-type layer comprising a p-type photovoltaic material; and a back contact layer having a thickness of 500 nm to 2500 nm, comprising at least one MXene material;

wherein the n-type layer is disposed between the p-type layer and the transparent conducting electrode;

wherein the p-type layer is in direct contact with the n-type layer and the back contact layer;

wherein at least one of the n-type layer and the p-type layer comprises CdTe, CdSeTe, or a combination thereof; and wherein the MXene material comprises a transition metal carbide or nitride from the group consisting of $Sc_2C$, $Sc_2N$, $Ti_2C$, $V_2C$, $V_2N$, $Cr_2C$, $Cr_2N$, $Zr_2C$, $Zr_2N$, $Nb_2C$, $Nb_2N$, $Hf_2C$, $Hf_2N$, $Ta_2C$, $Ti_3C_2$, $V_3C_2$, $Ta_3C_2$, $Ta_3N_2$, $(Cr_{2/3}\ Ti_{1/2})_3C_2$, $Ti_4C_3$, $Ti_4N_3$, $V_4C_3$, $V_4N_3$, $Ta_4C_3$, $Ta_4N_3$, $Nb_4C_3$, or a combination thereof.

2. The device of claim 1, wherein the MXene material comprises $Ti_3C_2$.

3. The device of claim 1, wherein the MXene material comprises terminations on at least one surface, the terminations comprising at least one functional group selected from the group consisting of alkoxide, carboxylate, halide, hydroxide, hydride, oxide, sub-oxide, nitride, sub-nitride, sulfide, and thiol.

4. The device of claim 1, wherein the MXene material is doped with one or more dopants.

5. The device of claim 1, wherein the MXene material is transparent or semitransparent.

6. The device of claim 1, further comprising a glass or plastic cover.

7. The device of claim 1, wherein the n-type layer and the p-type layer are graded.

8. A method of producing a photovoltaic device, the method comprising the steps of:

providing a substrate;

depositing a transparent conducting electrode over the substrate;

depositing an n-type layer comprising an n-type photovoltaic material over the transparent conducting electrode;

depositing a p-type layer comprising a p-type photovoltaic material over the n-type photovoltaic material; and depositing a back contact layer directly over the p-type layer; wherein the back contact layer has a thickness of 500 nm to 2500 nm and comprises an MXene material;

wherein at least one of the n-type layer and the p-type layer comprises CdTe, CdSeTe, or a combination thereof; and wherein the MXene material comprises a transition metal carbide or nitride from the group consisting of $Sc_2C$, $Sc_2N$, $Ti_2C$, $V_2C$, $V_2N$, $Cr_2C$, $Cr_2N$, $Zr_2C$, $Zr_2N$, $Nb_2C$, $Nb_2N$, $Hf_2C$, $Hf_2N$, $Ta_2C$, $Ti_3C_2$, $V_3C_2$, $Ta_3C_2$, $Ta_3N_2$, $(Cr_{2/3}\ Ti_{1/2})_3C_2$, $Ti_4C_3$, $Ti_4N_3$, $V_4C_3$, $V_4N_3$, $Ta_4C_3$, $Ta_4N_3$, $Nb_4C_3$, or a combination thereof.

9. The method of claim 8, wherein the step of depositing a back contact layer over the active layer comprises the step of spray-coating the MXene material over the active layer.

10. The method of claim 8, further comprising the step of chemically modifying at least one surface of the MXene material.

11. The method of claim 8, further comprising the step of doping the MXene material.

12. The method of claim 8, wherein the substrate comprises glass or a transparent organic polymer.

13. A method of generating electricity, the method comprising the step of subjecting a photovoltaic device to a light source;

wherein the photovoltaic device comprises:

a transparent conducting electrode layer;

an n-type layer comprising an n-type photovoltaic material;

a p-type layer comprising a p-type photovoltaic material; and a back contact layer having a thickness of 500 nm to 2500 nm, comprising at least one MXene material;

wherein the n-type layer is disposed between the p-type layer and the transparent conducting electrode;

wherein the p-type layer is in direct contact with the n-type layer and the back contact layer;

wherein at least one of the n-type layer and the p-type layer comprises CdTe, CdSeTe, or a combination thereof, and wherein the MXene material comprises a transition metal carbide or nitride from the group consisting of $Sc_2C$, $Sc_2N$, $Ti_2C$, $V_2C$, $V_2N$, $Cr_2C$, $Cr_2N$, $Zr_2C$, $Zr_2N$, $Nb_2C$, $Nb_2N$, $Hf_2C$, $Hf_2N$, $Ta_2C$, $Ti_3C_2$, $V_3C_2$, $Ta_3C_2$, $Ta_3N_2$, $(Cr_{2/3}\ Ti_{1/2})_3C_2$, $Ti_4C_3$, $Ti_4N_3$, $V_4C_3$, $V_4N_3$, $Ta_4C_3$, $Ta_4N_3$, $Nb_4C_3$, or a combination thereof.

14. The device of claim 1, wherein the active layer is doped p-type with Cu, P, As, or Sb, or n-type with In.

15. The device of claim 1, wherein the MXene material comprises a transition metal carbide or nitride from the group consisting of $Sc_2C$, $Sc_2N$, $Ti_2C$, $V_2C$, $V_2N$, $Cr_2C$, $Cr_2N$, $Zr_2C$, $Zr_2N$, $Nb_2C$, $Nb_2N$, $Hf_2C$, $Hf_2N$, $Ta_2C$, $Ti_3C_2$, $V_3C_2$, $Ta_3C_2$, $Ta_3N_2$, $(Cr_{2/3}\ Ti_{1/2})_3C_2$, $Ti_4C_3$, $Ti_4N_3$, $V_4C_3$, $V_4N_3$, $Ta_4C_3$, $Ta_4N_3$, $Nb_4C_3$, or a combination thereof;

wherein the MXene material further comprises surface terminations Tx comprising alkoxide, alkyl, carboxylate, halide, hydroxide, hydride, oxide, sub-oxide, nitride, sub-nitride, sulfide, sulfonate, thiol, or a combination thereof.

16. The device of claim 1, wherein the back contact layer has thickness of 500 nm to 1500 nm.

17. The device of claim 1, wherein the MXene material is doped with a dopant selected from the group consisting of phosphorous, nitrogen, cadmium telluride, cadmium selenide, lithium, vanadium, niobium, tantalum, gold, silver, tellurium, iron, copper, and cerium.

* * * * *